United States Patent
Lin et al.

(10) Patent No.: US 10,629,664 B2
(45) Date of Patent: Apr. 21, 2020

(54) POWER AND DATA ROUTING STRUCTURES FOR ORGANIC LIGHT-EMITTING DIODE DISPLAYS

(71) Applicant: Apple Inc., Cupertino, CA (US)

(72) Inventors: Chin-Wei Lin, San Jose, CA (US); Stephen S. Poon, San Jose, CA (US); Warren S. Rieutort-Louis, Cupertino, CA (US); Cheng-Ho Yu, Milpitas, CA (US); ChoongHo Lee, Cupertino, CA (US); Doh-Hyoung Lee, San Jose, CA (US); Ting-Kuo Chang, San Jose, CA (US); Tsung-Ting Tsai, Cupertino, CA (US); Vasudha Gupta, Cupertino, CA (US); Younggu Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/364,447

(22) Filed: Mar. 26, 2019

(65) Prior Publication Data
US 2019/0221624 A1     Jul. 18, 2019

Related U.S. Application Data

(63) Continuation of application No. 15/922,727, filed on Mar. 15, 2018, now Pat. No. 10,312,309, which is a
(Continued)

(51) Int. Cl.
*H01L 51/52*     (2006.01)
*G09G 3/3291*     (2016.01)
(Continued)

(52) U.S. Cl.
CPC .........  *H01L 27/3248* (2013.01); *G09G 3/006* (2013.01); *G09G 3/3233* (2013.01);
(Continued)

(58) Field of Classification Search
CPC .... G09G 3/006; G09G 3/3233; G09G 3/3258; G09G 3/3291; H01L 27/3248;
(Continued)

(56) References Cited

U.S. PATENT DOCUMENTS 9,299,757 B2    3/2016  Ko
9,368,058 B2 *  6/2016  Omata ................... H05B 33/08
(Continued)

FOREIGN PATENT DOCUMENTS

CN    1578571 A    2/2005
CN    1615056 A    5/2005
(Continued)

*Primary Examiner* — Sardis F Azongha
(74) *Attorney, Agent, or Firm* — Treyz Law Group, P.C.; G. Victor Treyz; David K. Cole

(57) ABSTRACT

An organic light-emitting diode display may have thin-film transistor circuitry formed on a substrate. The display and substrate may have rounded corners. A pixel definition layer may be formed on the thin-film transistor circuitry. Openings in the pixel definition layer may be provided with emissive material overlapping respective anodes for organic light-emitting diodes. A cathode layer may cover the array of pixels. A ground power supply path may be used to distribute a ground voltage to the cathode layer. The ground power supply path may be formed from a metal layer that is shorted to the cathode layer using portions of a metal layer that forms anodes for the diodes, may be formed from a mesh shaped metal pattern, may have L-shaped path segments, may include laser-deposited metal on the cathode layer, and may have other structures that facilitate distribution of the ground power supply.

13 Claims, 27 Drawing Sheets

Related U.S. Application Data continuation of application No. PCT/US2017/014161, filed on Jan. 19, 2017.

(60) Provisional application No. 62/300,617, filed on Feb. 26, 2016, provisional application No. 62/281,602, filed on Jan. 21, 2016.

(51) Int. Cl.
  *G09G 3/3258* (2016.01)
  *G09G 3/3233* (2016.01)
  *H01L 27/32* (2006.01)
  *G09G 3/00* (2006.01)

(52) U.S. Cl.
  CPC ......... *G09G 3/3258* (2013.01); *G09G 3/3291* (2013.01); *H01L 27/3246* (2013.01); *H01L 27/3276* (2013.01); *H01L 27/3279* (2013.01); *H01L 51/5228* (2013.01); *G09G 2300/0426* (2013.01); *G09G 2310/0297* (2013.01)

(58) Field of Classification Search
  CPC ............ H01L 27/3246; H01L 27/3276; H01L 27/3279; H01L 51/5228
  See application file for complete search history.

(56) References Cited

U.S. PATENT DOCUMENTS

| | | | |
|---|---|---|---|
| 9,412,327 B2 | 8/2016 | Kim | |
| 9,583,551 B2* | 2/2017 | Zhang | ................. H01L 51/5212 |
| 9,601,524 B2* | 3/2017 | Tae | ..................... H01L 27/1255 |
| 9,626,900 B2 | 4/2017 | Kawada | |
| 2002/0104995 A1* | 8/2002 | Yamazaki | ........... H01L 27/3246 257/72 |
| 2004/0263441 A1 | 12/2004 | Tanaka et al. | |
| 2005/0078105 A1 | 4/2005 | Suh | |
| 2005/0258771 A1 | 11/2005 | Kang et al. | |
| 2007/0029615 A1 | 2/2007 | Lai | |
| 2008/0088568 A1 | 4/2008 | Naga | |
| 2009/0189835 A1* | 7/2009 | Kim | ...................... G09G 3/3677 345/80 |
| 2009/0267877 A1 | 10/2009 | Yen et al. | |
| 2010/0134743 A1 | 6/2010 | Shin et al. | |
| 2014/0239270 A1 | 8/2014 | Ko et al. | |
| 2014/0253419 A1* | 9/2014 | Tanada | ................. G09G 3/2092 345/55 |
| 2015/0263079 A1 | 9/2015 | Ko | |
| 2015/0294622 A1 | 10/2015 | Chaji | |
| 2015/0373828 A1 | 12/2015 | Ye et al. | |
| 2016/0181350 A1 | 6/2016 | Lee | |
| 2016/0190166 A1 | 6/2016 | Kim et al. | |
| 2016/0240141 A1 | 8/2016 | Lee | |
| 2016/0240603 A1 | 8/2016 | Park et al. | |
| 2016/0365532 A1 | 12/2016 | Song et al. | |

FOREIGN PATENT DOCUMENTS

| | | |
|---|---|---|
| CN | 1700816 A | 11/2005 |
| CN | 1961251 A | 5/2007 |
| CN | 101064334 A | 10/2007 |
| CN | 101419349 A | 4/2009 |
| CN | 101889358 A | 11/2010 |
| CN | 103794163 A | 5/2014 |
| CN | 104659063 | 5/2015 |
| CN | 104752485 A | 7/2015 |
| CN | 204651320 U | 9/2015 |
| JP | H05-204338 A | 8/1993 |
| JP | 2000-227784 A | 8/2000 |
| JP | 2006-113376 | 4/2006 |
| JP | 2008-052951 A | 3/2008 |
| JP | 2009-134246 A | 6/2009 |
| JP | 2015-088275 | 5/2015 |
| JP | 2015088275 A | 5/2015 |

* cited by examiner

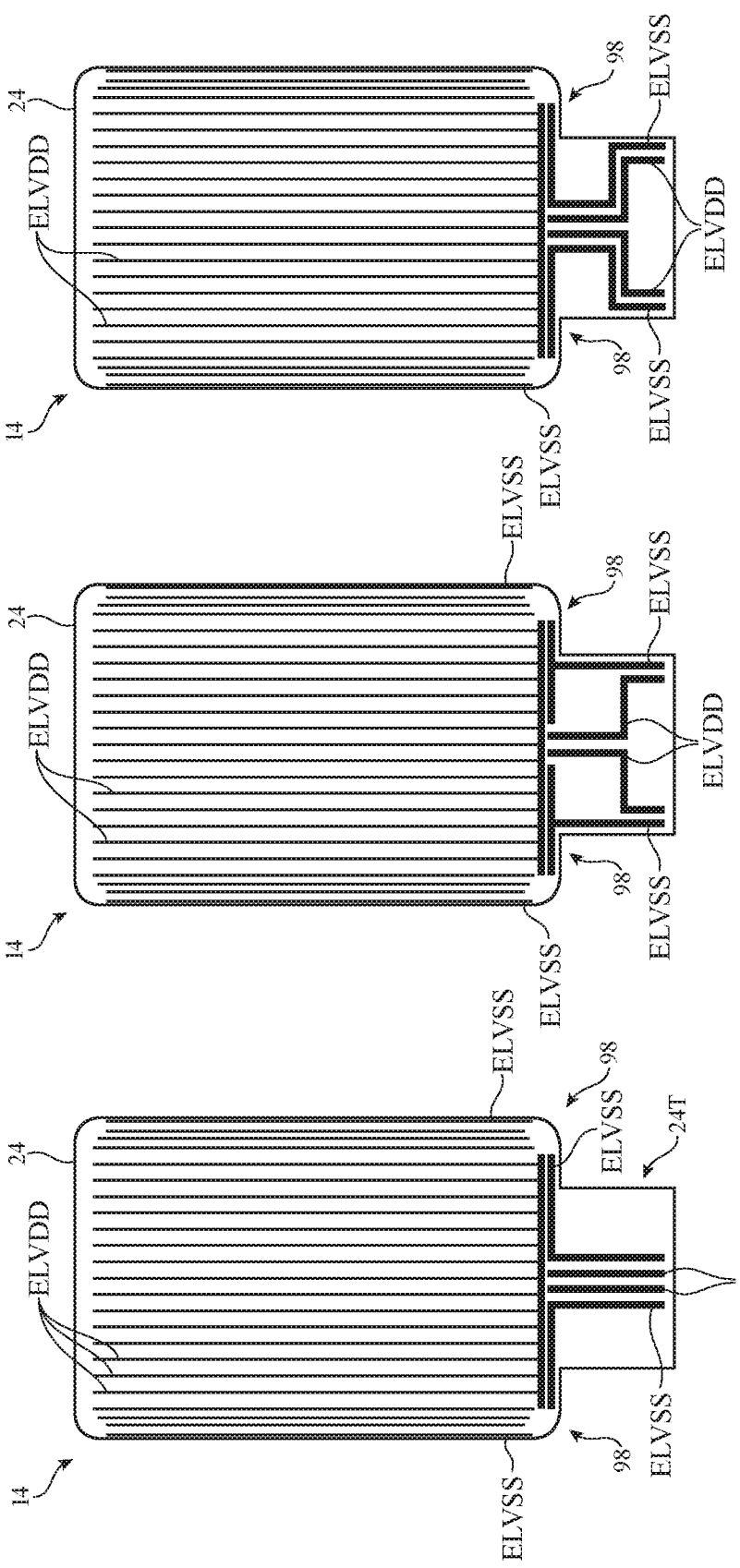

POWER AND DATA ROUTING STRUCTURES FOR ORGANIC LIGHT-EMITTING DIODE DISPLAYS

This is a continuation of U.S. patent application Ser. No. 15/922,727, filed Mar. 15, 2018, which is a continuation of International Application PCT/US2017/014161, with an international filing date of Jan. 19, 2017, which claims priority to U.S. Provisional Patent Application No. 62/281,602, filed Jan. 21, 2016, and U.S. Provisional Patent Application No. 62/300,617, filed Feb. 26, 2016, which are hereby incorporated by reference herein in their entireties. This application claims the benefit of and claims priority to U.S. patent application Ser. No. 15/922,727, filed Mar. 15, 2018, International Application PCT/US2017/014161, filed Jan. 19, 2017, U.S. Provisional Patent Application No. 62/281,602, filed Jan. 21, 2016, and U.S. Provisional Patent Application No. 62/300,617, filed Feb. 26, 2016.

BACKGROUND

This relates generally to electronic devices and, more particularly, to electronic devices with organic light-emitting diode displays.

Electronic devices often include displays. For example, an electronic device may have an organic light-emitting diode display based on organic-light-emitting diode pixels. Each pixel may have a pixel circuit that includes a respective light-emitting diode. Thin-film transistor circuitry in the pixel circuit may be used to control the application of current to the light-emitting diode in that pixel. The thin-film transistor circuitry may include a drive transistor. The drive transistor and the light-emitting diode in a pixel circuit may be coupled in series between a positive power supply and a ground power supply.

Signals in organic-light-emitting diode displays such as power supply signals may be subject to undesired voltage drops due to resistive losses in the conductive paths that are used to distribute these signals. If care is not taken, these voltage drops can interfere with satisfactory operation of an organic light-emitting diode display. Challenges may also arise in distributing power and data signals in displays having layouts in which signal routing space is limited.

It would therefore be desirable to be able to provide improve ways to distribute signals such as power supply and data signals on a display such as an organic light-emitting diode display.

SUMMARY

An organic light-emitting diode display may have thin-film transistor circuitry formed on a substrate. The display and substrate may have rounded corners. A pixel definition layer may be formed on the thin-film transistor circuitry. Openings in the pixel definition layer may be provided with emissive material overlapping respective anodes for organic light-emitting diodes.

A cathode layer may cover the array of pixels. A ground power supply path may be used to distribute a ground voltage to the cathode layer. The ground power supply path may be formed from a metal layer that is shorted to the cathode layer using portions of a metal layer that forms the anodes for the diodes, may be formed from a mesh shaped metal pattern, may have L-shaped path segments, may include laser-deposited metal on the cathode layer, and may have other structures that facilitate distribution of the ground power supply. Mesh-shaped metal patterns (e.g., a metal power supply mesh path), metal patterns with L-shaped path segments, and other structures may also be used to facilitate distribution of positive power supply voltages. These power supply path structures may accommodate displays and substrates with rounded corners.

BRIEF DESCRIPTION OF THE DRAWINGS

FIGS. 8, 9, and 10 show illustrative power supply path layouts for a display with a flexible tail portion in accordance with an embodiment.

DETAILED DESCRIPTION

Figure 1:
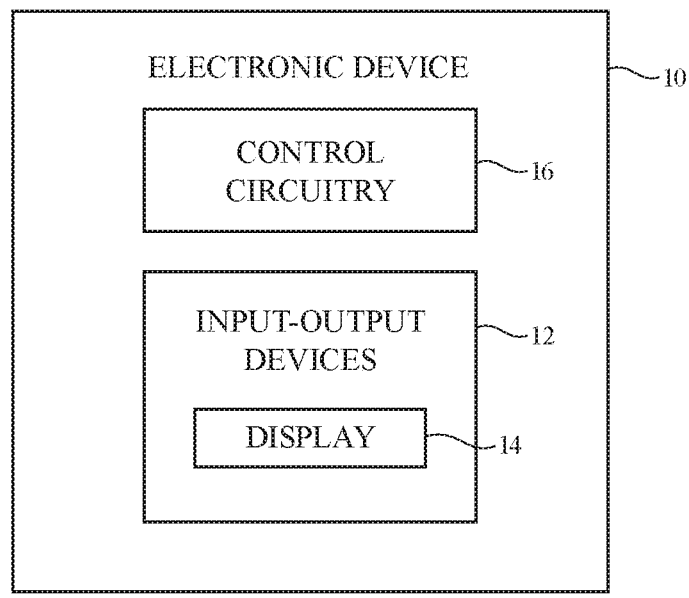
FIG. 1 is a diagram of an illustrative electronic device having a display in accordance with an embodiment.

An illustrative electronic device of the type that may be provided with an organic light-emitting diode display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted).

Control circuitry 16 may be used to run software on device 10 such as operating system code and applications. During operation of device 10, the software running on control circuitry 16 may display images on display 14.

Figure 2:
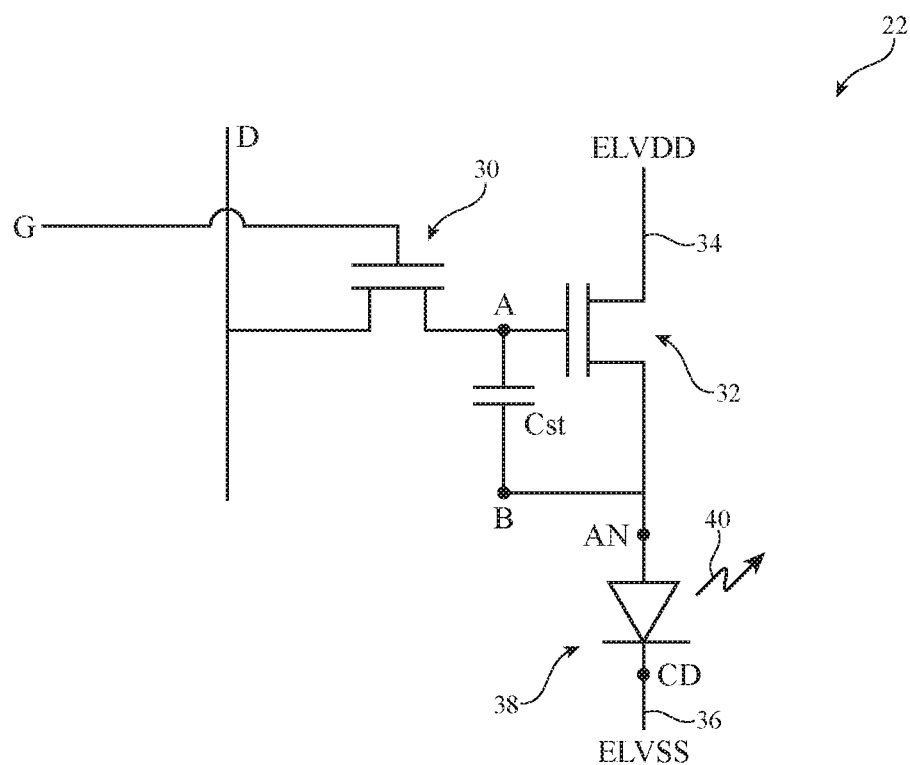
FIG. 2 is a diagram of an illustrative organic light-emitting diode pixel circuit in accordance with an embodiment.

Display 14 may be an organic light-emitting diode display. In an organic light-emitting diode display, each pixel contains a respective organic light-emitting diode. A schematic diagram of an illustrative organic light-emitting diode pixel is shown in FIG. 2. As shown in FIG. 2, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 32 is held in a desired state between successive frames of data, display pixel 22 may include a storage capacitor such as storage capacitor Cst. A first terminal of storage capacitor Cst may be coupled to the gate of transistor 32 at node A and a second terminal of storage capacitor Cst may be coupled to anode AN of diode 38 at node B. The voltage on storage capacitor Cst is applied to the gate of transistor 32 at node A to control transistor 32. Data can be loaded into storage capacitor Cst using one or more switching transistors such as switching transistor 30. When switching transistor 30 is off, data line D is isolated from storage capacitor Cst and the gate voltage on node A is equal to the data value stored in storage capacitor Cst (i.e., the data value from the previous frame of display data being displayed on display 14). When gate line G (sometimes referred to as a scan line) in the row associated with display pixel 22 is asserted, switching transistor 30 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38.

If desired, the circuitry for controlling the operation of light-emitting diodes for pixels 22 in display 14 (e.g., transistors, capacitors, etc. in display pixel circuits such as the display pixel circuit of FIG. 2) may be formed using configurations other than the configuration of FIG. 2 (e.g., configurations that include circuitry for compensating for threshold voltage variations in drive transistor 32, configurations in which an emission enable transistor is coupled in series with drive transistor 32, configurations with multiple switching transistors controlled by multiple respective scan lines, configurations with multiple capacitors, etc.). The circuitry of pixel 22 of FIG. 2 is merely illustrative.

Figure 3:
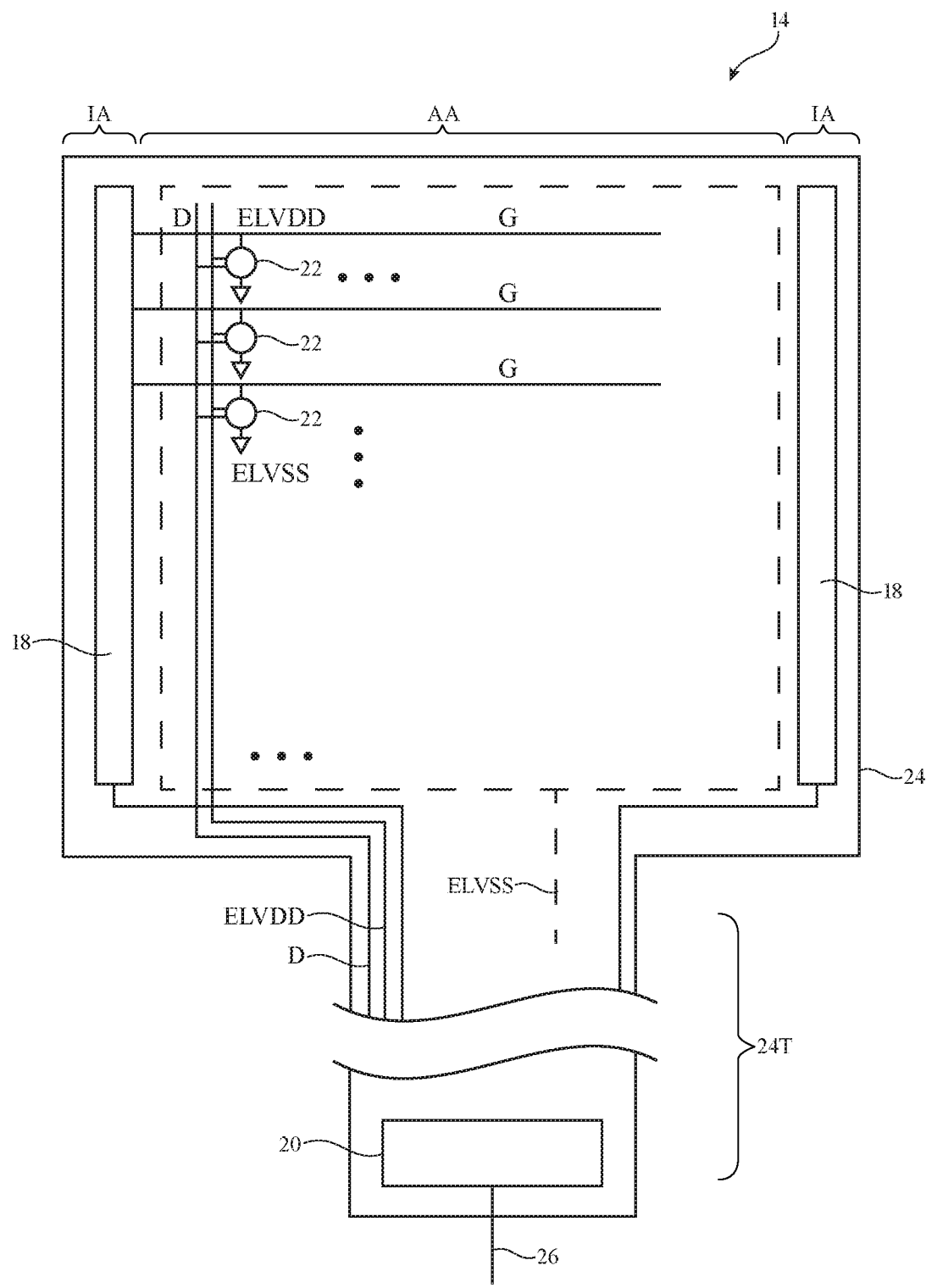
FIG. 3 is a diagram of an illustrative organic light-emitting diode display in accordance with an embodiment.

As shown in FIG. 3, display 14 may include layers such as substrate layer 24. Substrate 24 and, if desired, other layers in display 14, may be formed from layers of material such as glass layers, polymer layers (e.g., flexible sheets of polyimide or other flexible polymers), etc. Substrate 24 may be planar and/or may have one or more curved portions. Substrate 24 may have a rectangular shape with left and right vertical edges and upper and lower horizontal edges or may have a non-rectangular shape. In configurations in which substrate 24 has a rectangular shape with four corners, the corners may, if desired, be rounded. Display substrate 24 may, if desired, have a tail portion such as tail 24T.

Display 14 may have an array of pixels 22. Pixels 22 form an active area AA of display 14 that displays images for a user. Inactive border portions of display 14 such as inactive areas IA along one or more of the edges of substrate 24 do not contain pixels 22 and do not display images for the user (i.e., inactive area IA is free of pixels 22).

Each pixel 22 may have a light-emitting diode such as organic light-emitting diode 38 of FIG. 2 and associated thin-film transistor circuitry (e.g., the pixel circuit of FIG. 2 or other suitable pixel circuitry). The array of pixels 22 may be formed from rows and columns of pixel structures (e.g., pixels formed from structures on display layers such as substrate 24). There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, and blue pixels that emit blue light. Configurations for display 14 that include pixels of other colors may be used, if desired. The use of a pixel arrangement with red, green, and blue pixels is merely illustrative.

As shown in the example of FIG. 3, display substrate 24 may have a tail portion such as tail 24T that has a narrower width than the portion of substrate 24 that contains active area AA. This arrangement helps accommodate tail 24T within the housing of device 10. Tail 24T may, if desired, be bent under the rest of display 14 when display 14 is mounted within an electronic device housing.

Display driver circuitry 20 for display 14 may be mounted on a printed circuit board that is coupled to tail portion 24T or may be mounted on tail portion 24T. Signal paths such as signal path 26 may couple display driver circuitry 20 to control circuitry 16. Circuitry 20 may include one or more display driver integrated circuits and/or thin-film transistor circuitry. During operation, the control circuitry of device 10 (e.g., control circuitry 16 of FIG. 1) may supply circuitry such as display driver circuitry 20 with information on images to be displayed on display 14. To display the images on display pixels 22, display driver circuitry 20 may supply corresponding image data to data lines D while issuing clock signals and other control signals to supporting display driver circuitry such as gate driver circuitry 18. Gate driver circuitry 18 may produce gate line signals (sometimes referred to as scan signals, emission enable signals, etc.) or other control signals for pixels 22. The gate line signals may be conveyed to pixels 22 using lines such as gate lines G. There may be one or more gate lines per row o pixels 22. Gate driver circuitry 18 may include integrated circuits and/or thin-film transistor circuitry and may be located along the edges of display 14 (e.g., along the left and/or right edges of display 14 as shown in FIG. 3) or elsewhere in display 14 (e.g., as part of circuitry 20 on tail 24T, along the lower edge of display 14, etc.). The configuration of FIG. 3 is merely illustrative.

Display driver circuitry 20 may supply data signals onto a plurality of corresponding data lines D. With the illustrative arrangement of FIG. 3, data lines D run vertically through display 14. Data lines D are associated with respective columns of pixels 22.

With the illustrative configuration of FIG. 3, gate lines G (sometimes referred to as scan lines, emission lines, etc.) run horizontally through display 14. Each gate line G is associated with a respective row of display pixels 22. If desired, there may be multiple horizontal control lines such as gate lines G associated with each row of pixels 22. Gate driver circuitry 18 may assert gate line signals on the gate lines G in display 14. For example, gate driver circuitry 18 may receive clock signals and other control signals from display driver circuitry 20 and may, in response to the received signals, assert a gate signal on gate lines G in sequence, starting with the gate line signal G in the first row of display pixels 22. As each gate line is asserted, data from data lines D is loaded into the corresponding row of display pixels. In this way, control circuitry in device 10 such as display driver circuitry 20 may provide pixels 22 with signals that direct pixels 22 to generate light for displaying a desired image on display 14.

The circuitry of pixels 22 and, if desired, display driver circuitry such as circuitry 18 and/or 20 may be formed using thin-film transistor circuitry. Thin-film transistors in display 14 may, in general, be formed using any suitable type of thin-film transistor technology (e.g., silicon transistors such as polysilicon thin-film transistors, semiconducting-oxide transistors such as indium gallium zinc oxide transistors, etc.).

Conductive paths (e.g., one or more signal lines, blanket conductive films, and other patterned conductive structures) may be provided in display 14 to route data signals D and power signals such as positive power supply signal ELVDD and ground power supply signal ELVSS to pixels 22. As shown in FIG. 3, these signals may be provided to pixels 22 in active area AA using signal routing paths that receive signals D, ELVDD, and ELVSS from tail portion 24T of display 14.

Figure 4:
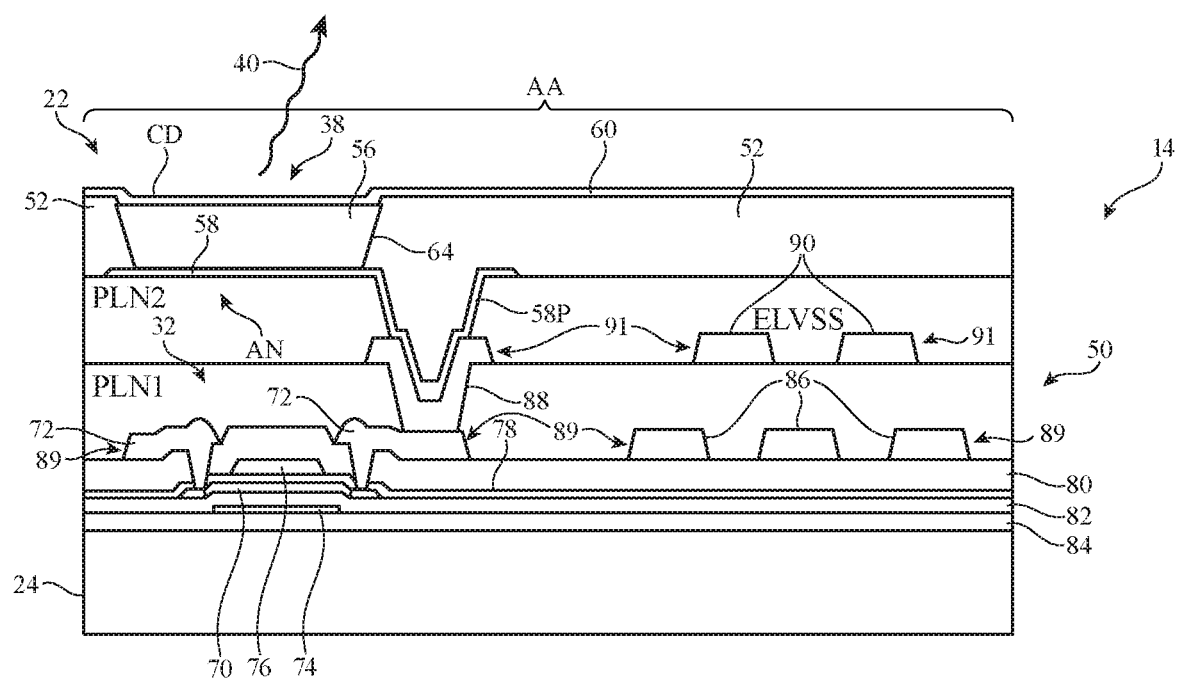
FIG. 4 is a cross-sectional side view of a portion of an active area of an illustrative organic light-emitting diode display in accordance with an embodiment.

A cross-sectional side view of a portion of active area AA of display 14 showing an illustrative configuration that may be used for forming pixels 22 is shown in FIG. 4. As shown in FIG. 4, display 14 may have a substrate such as substrate 24. Thin-film transistors, capacitors, and other thin-film transistor circuitry 50 (e.g., pixel circuitry such as the illustrative pixel circuitry of FIG. 2) may be formed on substrate 24. Pixel 22 may include organic light-emitting diode 38. Anode AN of diode 38 may be formed from metal layer 58 (sometimes referred to as an anode metal layer). Each diode 38 may have a cathode CD from conductive cathode structures such as cathode layer 60. Layer 60 may be, for example, a thin layer of metal such as a layer of magnesium silver with a thickness of 10-18 nm, more than 8 nm, less than 25 nm, etc. Layer 60 may cover all of pixels 22 in active area AA of display 14 and may have portions that extend into inactive area IA display 14 (e.g., so that layer 60 is coupled to ground power supply paths that supply layer 60 with ground power supply voltage ELVSS).

Each diode 38 has an organic light-emitting emissive layer (sometimes referred to as emissive material or an emissive layer structure) such as emissive layer 56. Emissive layer 56 is an electroluminescent organic layer that emits light 40 in response to applied current through diode 38. In a color display, emissive layers 56 in the array of pixels in the display include red emissive layers for emitting red light in red pixels, green emissive layers for emitting green light in green pixels, and blue emissive layers for emitting blue light in blue pixels. In addition to the emissive organic layer in each diode 38, each diode 38 may include additional layers for enhancing diode performance such as an electron injection layer, an electron transport layer, a hole transport layer, and a hole injection layer. Layers such as these may be formed from organic materials (e.g., materials on the upper and lower surfaces of electroluminescent material in layer 56).

Layer 52 (sometimes referred to as a pixel definition layer) has an array of openings containing respective portions of the emissive material of layer 56. An anode AN is formed at the bottom of each of these openings and is overlapped by emissive layer 56. The shape of the diode opening in pixel definition layer 52 therefore defines the shape of the light-emitting area for diode 38.

Pixel definition layer 52 may be formed from a photoimageable material that is photolithographically patterned (e.g., dielectric material that can be processed to form photolithographically defined openings such as photoimageable polyimide, photoimageable polyacrylate, etc.), may be formed from material that is deposited through a shadow mask, or may be formed from material that is otherwise patterned onto substrate 24. The walls of the diode openings in pixel definition layer may, if desired, be sloped, as shown by sloped sidewalls 64 in FIG. 4.

Thin-film circuitry 50 may contain transistor such as illustrative transistor 32. Thin-film transistor circuitry such as illustrative thin-film transistor 32 of FIG. 4 may have active areas (channel regions) formed from a patterned layer of semiconductor such as layer 70. Layer 70 may be formed from a semiconductor layer such as a layer of polysilicon or a layer of a semiconducting-oxide material (e.g. indium gallium zinc oxide). Source-drain terminals 72 may contact opposing ends of semiconductor layer 70. Gate 76 may be formed from a patterned layer of gate metal or other conductive layer and may overlap semiconductor 70. Gate insulator 78 may be interposed between gate 76 and semiconductor layer 70. A buffer layer such as dielectric layer 84 may be formed on substrate 24 under shield 74. A dielectric layer such as dielectric layer 82 may cover shield 74. Dielectric layer 80 may be formed between gate 76 and source-drain terminals 72. Layers such as layers 84, 82, 78, and 80 may be formed from dielectrics such as silicon oxide, silicon nitride, other inorganic dielectric materials, or other dielectrics. Additional layers of dielectric such as organic planarization layers PLN1 and PLN2 may be included in thin-film transistor structures such as the structures of transistor 32 and may help planarize display 14.

Display 14 may have multiple layers of conductive material embedded in the dielectric layers of display 14 such as metal layers for routing signals through pixels 22. Shield layer 74 may be formed from a first metal layer (as an example). Gate layer 76 may be formed from a second metal layer. Source-drain terminals such as terminals 72 and other structures such as signal lines 86 may be formed from portions of a third metal layer such as metal layer 89. Metal layer 89 may be formed on dielectric layer 80 and may be covered with planarization dielectric layer PLN1. A fourth layer of metal such as metal layer 91 may be used in forming diode via portion 88 and signal lines 90. In active area AA, a fifth layer of metal such as anode metal layer 58 may form anodes AN of diodes 38. The fifth metal layer in each pixel may have a portion such as via portion 58P that is coupled to via portion 88, thereby coupling one of the source-drain terminals of transistor 32 to anode AN of diode 38. A sixth layer of metal (e.g., a blanket film) such as cathode metal layer 60 may be used in forming cathode CD for light-emitting diode 38. Anode layer 58 may be interposed between metal layer 91 and cathode layer 60. Layers such as layer 58, 91, 89, 76, and 74 may be embedded within the dielectric layers of display 14 that are supported on substrate 24. If desired, fewer metal layers may be provided in display 14 or display 14 may have more metal layers. The configuration of FIG. 4 is merely illustrative.

It is desirable to minimize ohmic losses (sometimes referred to as IR losses) when distributing power signals to pixels 22 to ensure that display 14 operates efficiently and produces images with even brightness across display 14. Ohmic losses may be minimized by incorporating low-resistance signal pathways into through display 14.

Some of the layers of display 14 such as cathode layer 60 may be thin. Cathode layer 60 may be formed from a metal such as magnesium silver. To ensure that cathode CD is sufficiently thin to be transparent, the thickness of layer 60 may be about 10-18 nm (or other suitable thickness). In this type of configuration, the sheet resistance of layer 60 may be relatively large (e.g., about 10 ohm/square). To reduce the sheet resistance of the cathode and thereby allow ground power supply voltage ELVSS to be distributed to the cathode terminals of diodes 38 in pixels 22 with minimal IR losses, display 14 may be provided with supplemental conductive paths. Such paths may also help display 14 of FIG. 4 (or displays with other types of thin-film stackups) accommodate display geometries with geometries that constrain signal distribution (e.g., displays with rounded corners, etc.).

With one illustrative configuration, portions of metal layer 91 may be used in forming signal paths such as signal paths 90 that serve as a supplemental ELVSS path (i.e., a signal path that can operate in parallel with the ELVSS path formed by cathode layer 60) and thereby help to minimize voltage drops and IR losses when operating display 14. Metal layer 91 may be shorted to cathode layer 60 along one or more of the edges of display 14 (e.g., along the left, right, and bottom edges, along two or more edges, three or more edges, etc.) and may provide a low resistance path between a source of signal ELVSS on tail 24T and respective edges of cathode layer 60 (i.e., there may be less resistance experienced when distributing a signal to the edge of layer 60 through signal lines in layer 91 than when distributing a signal to this portion of layer 60 through the thin metal of layer 60 itself). Reducing IR losses as power is supplied to layer 60 helps reduce power losses when driving diodes 38 in active area AA. The use of a portion of layer 91 to form part of the ground power supply path for distributing ELVSS in display 14 may also make it possible to reduce the width of inactive area IA.

Figure 5:
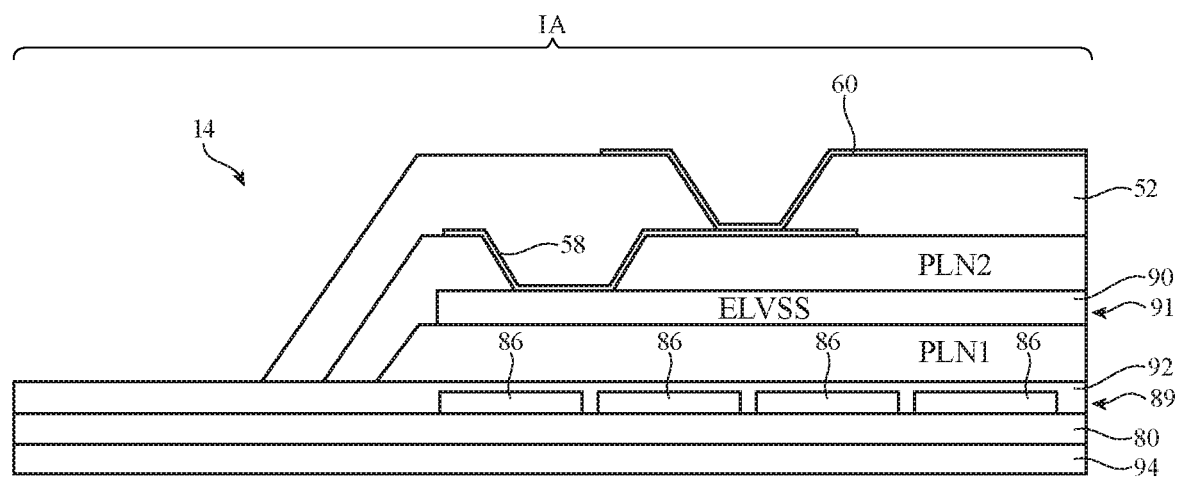
FIG. 5 is cross-sectional side view of a portion of an inactive border area of an illustrative organic light-emitting diode display in accordance with an embodiment.

FIG. 5 is a cross-sectional side view of a portion of inactive area IA of display 14 showing how a supplemental ELVSS power distribution path (path 90) may be shorted to cathode layer 60 through a portion of the same metal layer (metal layer 58) that is used in forming anodes AN in active area AA. As shown in FIG. 5, cathode layer 60 may be coupled to anode metal layer 58 through an opening in pixel definition layer 52. Anode metal layer 58 may, in turn, be shorted to a portion of metal layer 91 that forms supplemental path 90 through an opening in planarization layer PLN2. Peripheral signal lines in inactive area IA such as signal lines 86 (e.g., signals lines associated with gate line signals, signals for gate driver circuitry 18, and/or other signals for display 14) may be formed from portion of metal layer 89 under path 90. Dielectric layer 92 may cover portions of lines 86, if desired. Lines 86 may be formed on dielectric layer 80 or other dielectric, which may, in turn, be formed on thin-film circuitry and substrate structures 94 (see, substrate 24 and the dielectric and metal layers of circuitry 50 of FIG. 4). With the arrangement of FIG. 5, ELVSS path 90 may be stacked on top of other signal lines such as lines 86, which allows the width of inactive area IA to be minimized.

Figure 6:
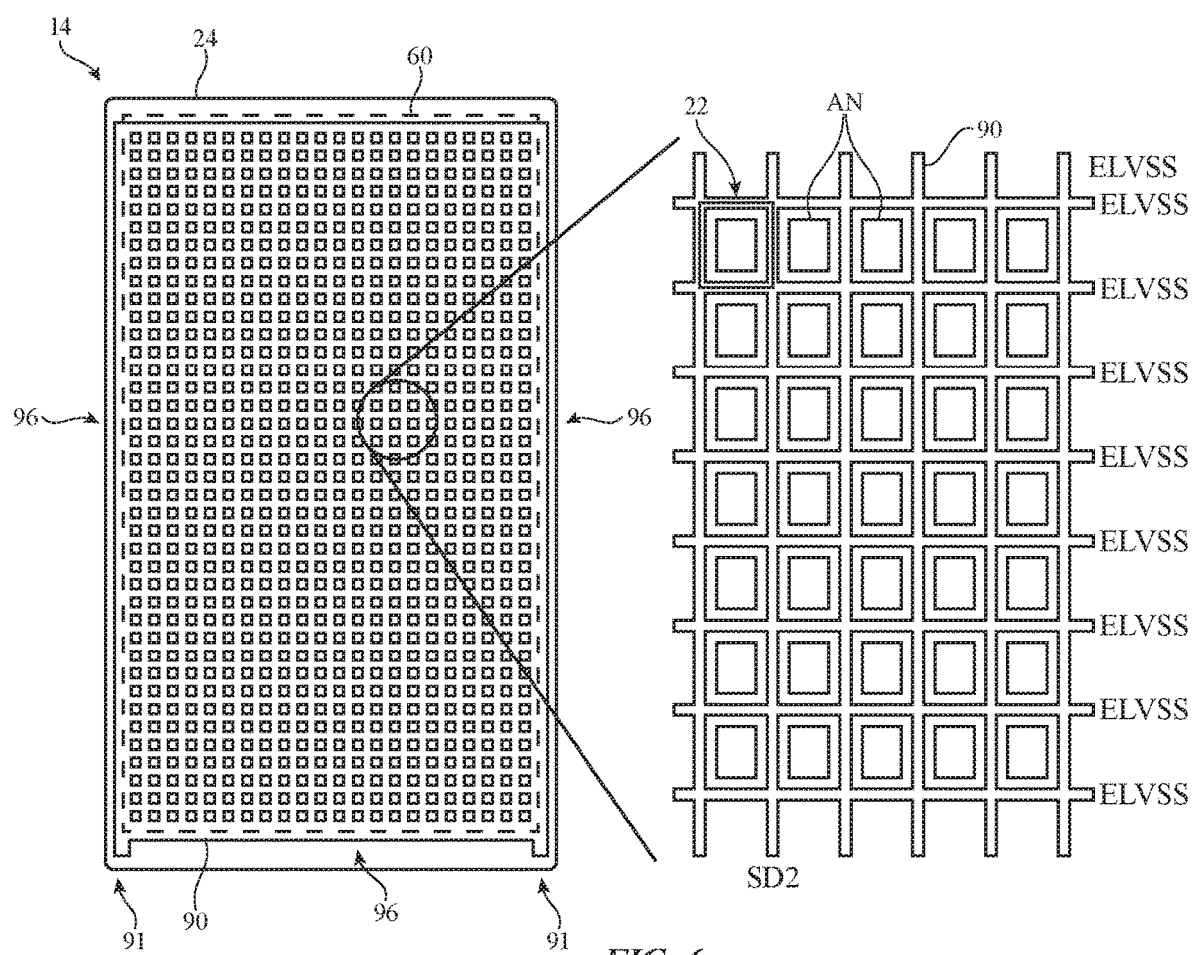
FIG. 6 is a diagram showing an illustrative mesh pattern that may be used for a ground power supply path in a display in accordance with an embodiment.

FIG. 6 is a top view of display 14 showing how ELVSS path 90 may be have a mesh shape with openings to accommodate anodes AN. ELVSS path 90 may be shorted to cathode 60 along edges 96 of display 14, using shorting paths of the type shown in FIG. 5 and may, if desired, be shorted to cathode 60 using vias in active area AA. When supplemental ground power supply paths such as the mesh-shaped path (metal power supply mesh path) 90 of FIG. 6 are included in display 14, the sheet resistance of the ground path for ground power supply signal ELVSS may be reduced (e.g., to less than 0.1 ohm/square or other suitable value). If desired, supplemental ground paths 90 for signal ELVSS may have non-mesh shapes (e.g., paths 90 may include vertical lines, horizontal lines, L-shaped segments, combinations of horizontal and vertical lines, sparse meshes, dense meshes, combinations of mesh structures and non-mesh structures, or other suitable shapes). The mesh shape for path 90 of FIG. 6 is merely illustrative.

Figure 7:
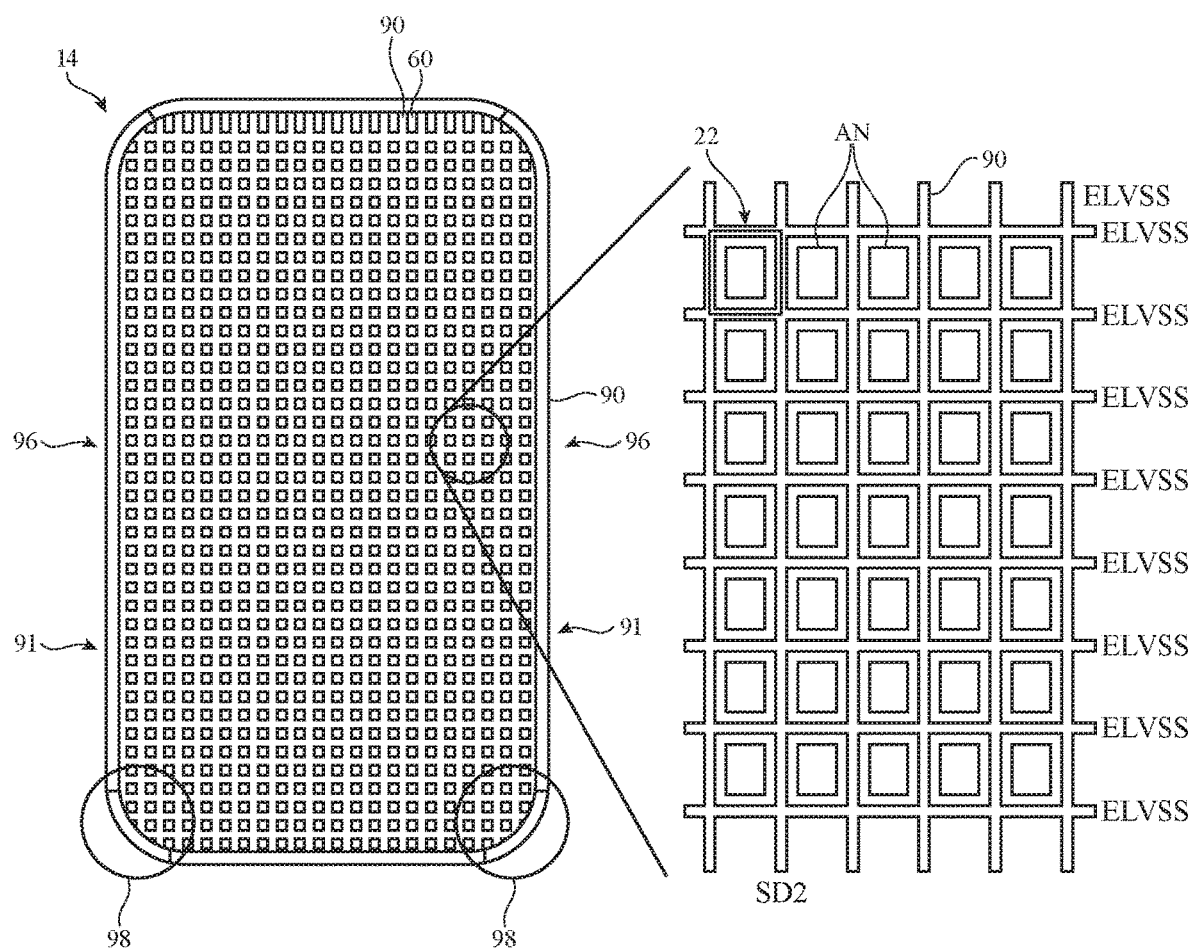
FIG. 7 is a diagram showing how the ground power supply path of FIG. 6 may be used in a display with rounded corners in accordance with an embodiment.

As illustrated in FIG. 7, display 14 may have features such as rounded corners that limit the amount of space available for signal paths. In this type of situation, strips of metal for path 90 may extend along edges 96 and may be shorted to cathode layer 60. At corners 98, there may not be sufficient room to form peripheral strips of metal layer 91. Nevertheless, due to the presence of the mesh-shaped portions of metal layer (i.e., the mesh shaped portions of path 90), there will be a low resistance path for ELVSS (e.g., a path that shorts the strip of metal associated with path 90 on the lower edges 96 of display 14 to the strips of metal associated with path 90 on the left and right edges of display 14, etc.). If desired, ELVDD paths in display 14 may be provided with mesh-shaped metal traces (e.g., portions of the metal traces that are used in forming gate metal layer 76, signal lines 86, source drain layer 90, anode metal layer 58, and/or cathode metal layer 60 may be used in forming a low-resistance mesh-shaped positive power supply distribution path for ELVDD such as a path having a shape of the type shown by the ELVSS traces of FIG. 6). For example, a mesh such as the mesh shaped portions of path 90 (a metal power supply mesh path) may be used as an ELVDD path.

FIGS. 8, 9, and 10 show illustrative patterns for forming ELVSS and ELVDD distribution lines from tail portion 24T to the lower edge 96 of display 14. With arrangements such as these in which power lines ELVDD and ELVSS are routed along the center of tail 24T, power routing may be performed away from dimension-constrained portions of display 14 such as corners 98.

Figure 11:
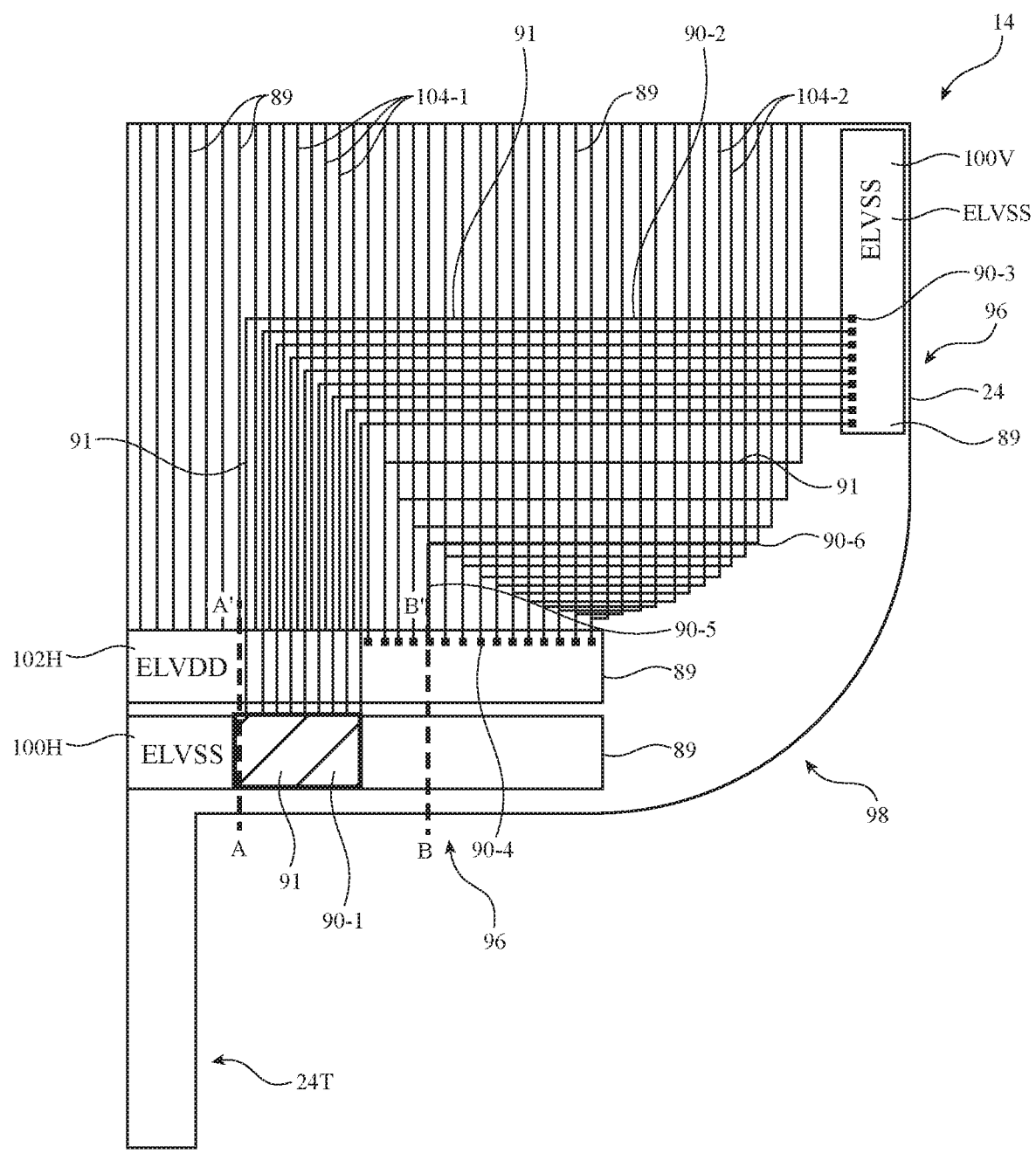
FIG. 11 is a top view of a corner portion of a display with positive and ground power supply path structures in accordance with an embodiment.

FIGS. 11, 12, 13, 14, 15, 16, and 17 show illustrative arrangements for distributing positive power supply voltage ELVDD and ground power supply voltage ELVSS at corners 98 of display 14. As shown in FIG. 11, lower edge 96 of display 14 may be provided with horizontal ELVSS distribution path 100H (e.g., a strip of metal that runs along the lower edge of display 14) and vertical edges 96 of display 14 may be provided with vertical ELVSS distribution paths (e.g., strips of metal that run along the left and right edges of display 14) such as path 100V.

Paths 100H and 100V may be formed from metal layer 89. There may be a gap between paths 100H and 100V at corners 98 of display 14 (e.g., display 14 and substrate 24 may have rounded corners that limit the space available for power supply distribution at corners 98). Using L-shaped paths formed from portions of metal layer 91 at corners 98 and other conductive paths, path 100H may be shorted to each path 100V. For example, metal layer 91 may have a portion such as portion 90-1 that is shorted to path 100H, connections 90-3 that short metal layer 91 to metal layer 89 in path 100V, and L-shaped segments 90-2 that short portion 90-1 to respective connection points 90-3. Positive power supply (ELVDD) path 102H (e.g., a positive power supply strip-shaped path formed from a strip of metal that runs parallel to one of the strips of metal that form the ELVSS paths along the edges of display 14) may be shorted directly to some vertical ELVDD distribution paths such as vertical lines 104-1 (formed in layer 89). Other vertical ELVDD distribution paths such as vertical lines 104-2 are disconnected from path 102H at corners 98 due to the rounded shape of display 14 at corners 98, but can be reconnected to path 102H using L-shaped path portions such as path 90-5 that are coupled between contacts on path 102H (see, e.g., contact 90-4) and contacts 90-6 that short metal layer 91 of L-shaped paths 90-5 to metal layer 89 of vertical lines 104. L-shaped paths may be used in distributing ELVSS, L-shaped paths may be used in distributing ELVDD (e.g., in configurations in which a mesh-shaped ELVDD path is used in display 14, configurations in which metal strips such as paths 100H and 100V are used as part of an ELVDD path, and/or in other configurations).

Figure 12:
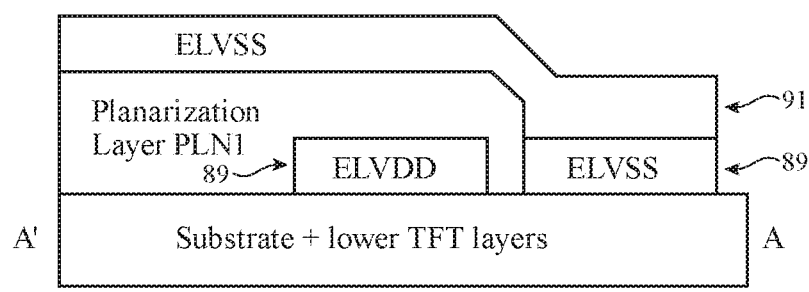
FIGS. 12 and 13 are cross-sectional side views of portions of the display of FIG. 11 in accordance with an embodiment.
Figure 13:
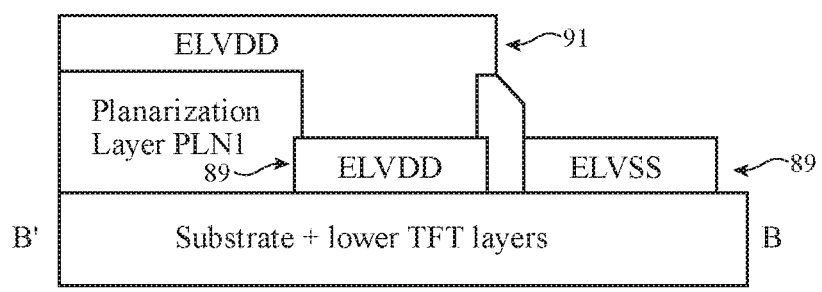

FIGS. 12 and 13 are cross-sectional side views of display 14 of FIG. 11 taken along lines A'-A and B'-B, respectively. As shown in FIGS. 12 and 13, planarization layer material (e.g., planarization layer PLN1) may separate the metal layer 91 of segments 90-2 and segments 90-5 from metal lines in layer 89.

Figure 14:
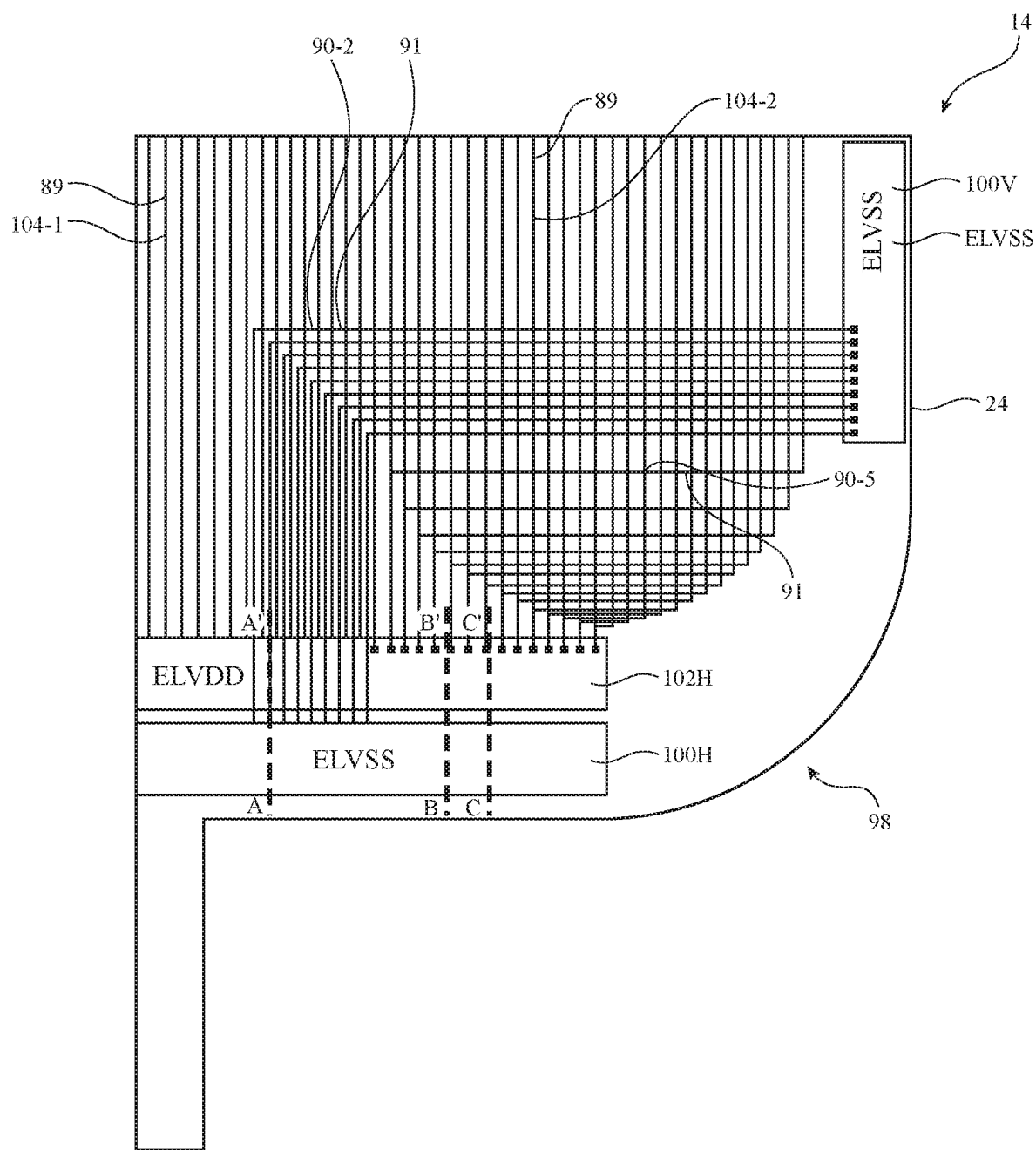
FIG. 14 is a top view of a corner portion of a display with positive and ground signal routing structures in accordance with another embodiment.
Figure 15:
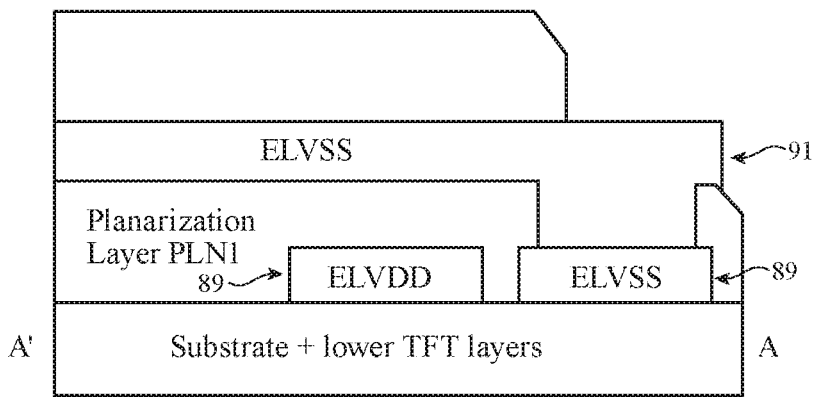
FIGS. 15, 16, and 17 are cross-sectional side views of portions of the display of FIG. 14 in accordance with an embodiment.
Figure 16:
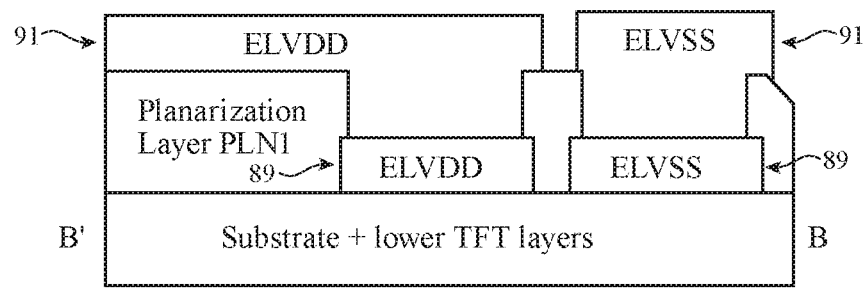
Figure 17:
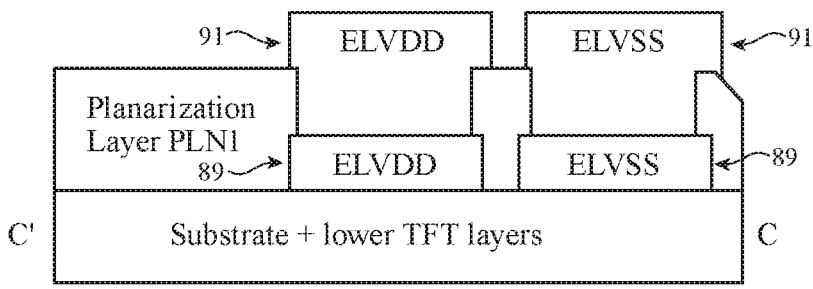
Figure 18:
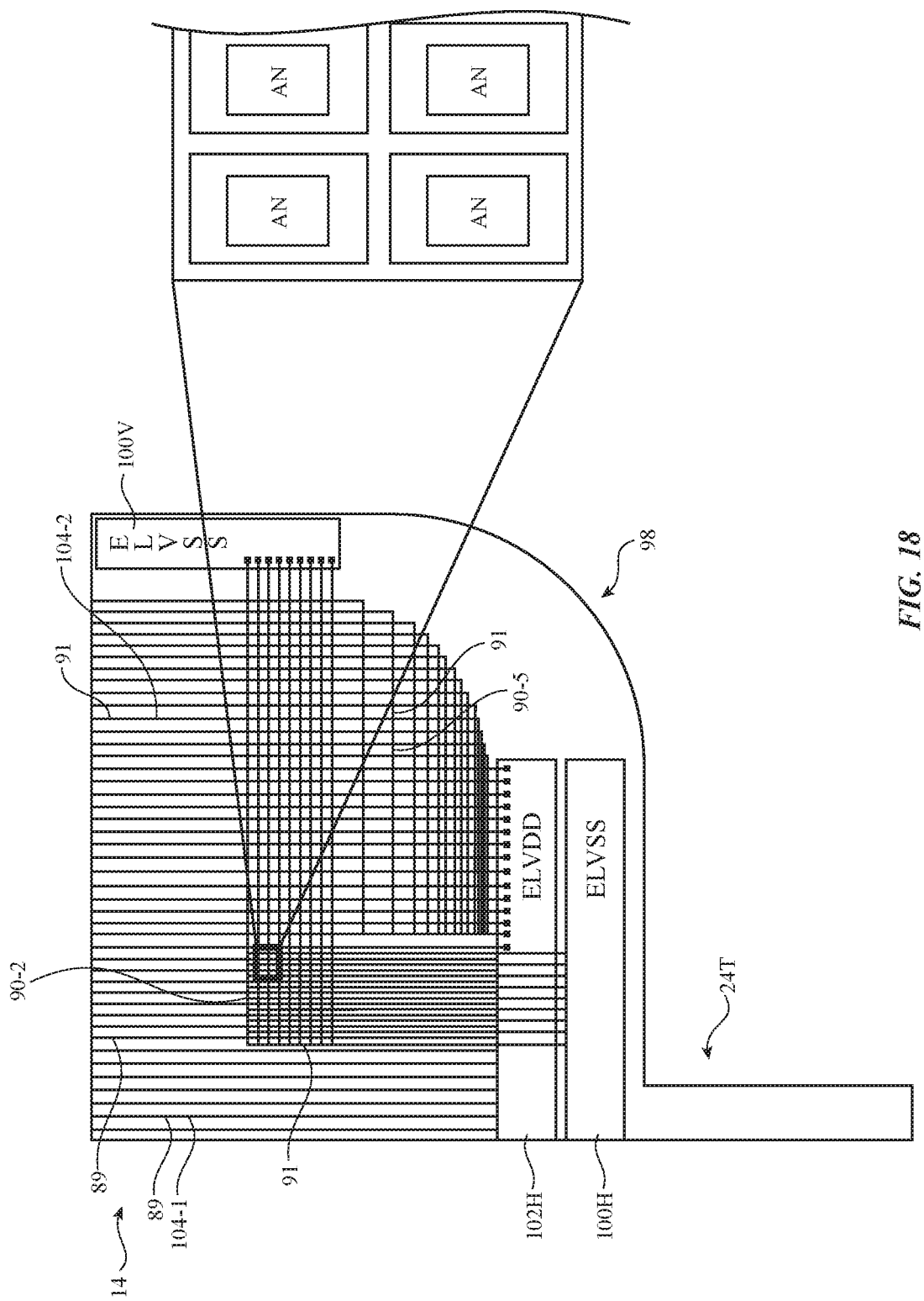
FIG. 18 is a diagram of an illustrative display having power supply paths formed from metal lines, mesh-shaped structures (e.g., a metal power supply mesh path), and strip-shaped paths in accordance with an embodiment.

In the illustrative arrangement of FIG. 14, path 100H and path 102H have been formed from two layers of metal (89 and 91). The cross-sectional side views of FIGS. 15, 16, and 17 (corresponding to cross-sectionals taken along A-A', B-B', and C-C' of FIG. 14, respectively) show how planarization layer PLN1 may be used to separate upper metal layer 91 in segments 90-2 and 90-5 from underlying metal lines. If desired, the paths formed from segments 90-2 and/or segments 90-5 may be implemented using mesh-shaped paths, as shown in FIG. 18.

Figure 19:
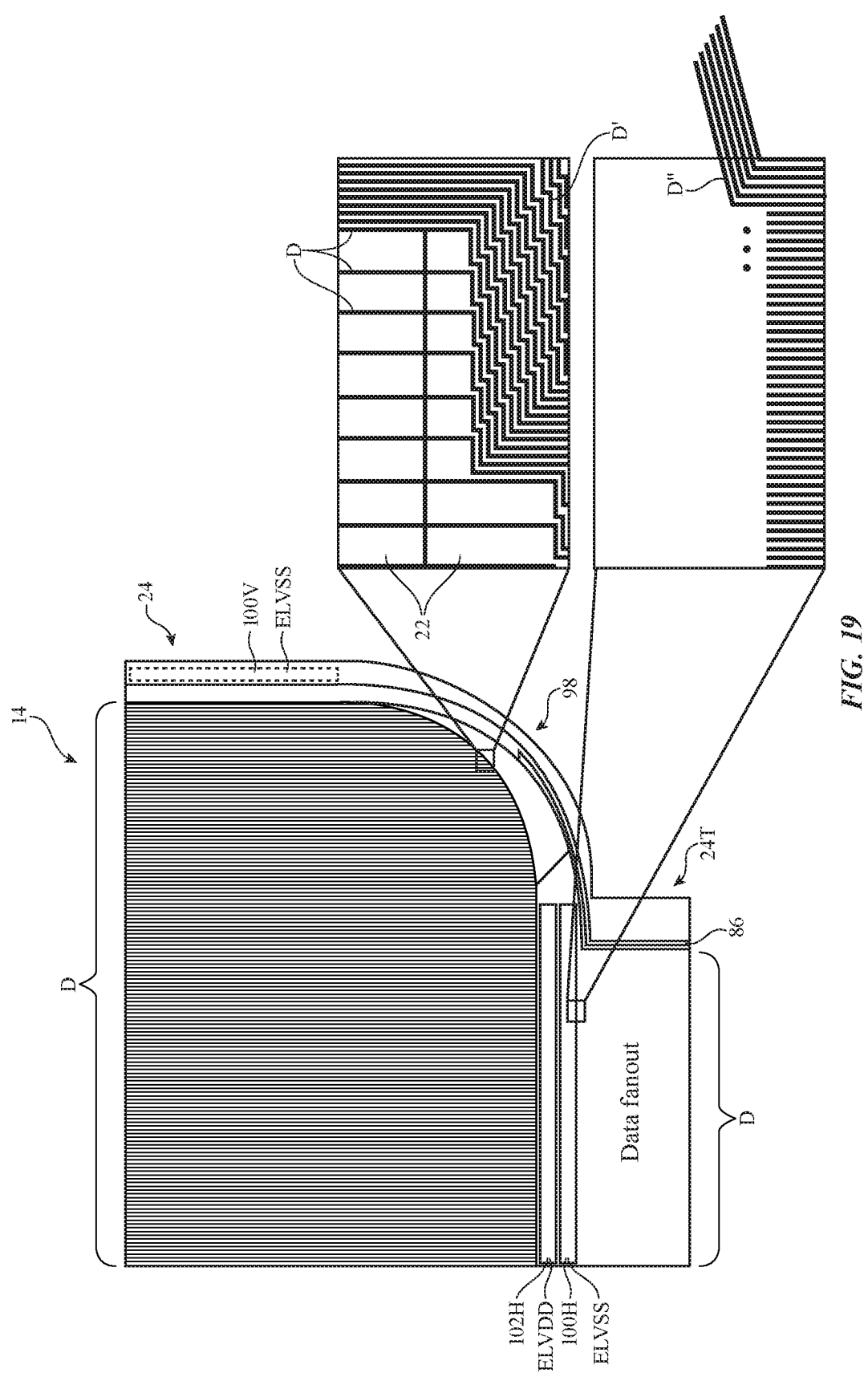
FIG. 19 is a diagram showing how a display may have data lines with staircase-shaped portions to accommodate rounded display corners in accordance with an embodiment.

Data line distribution paths near corners 98 may be constrained for space due to the shape of corners 98. Data lines D may be accommodated at corners 98 by using a ladder shape (staircase shape) for data lines D at corners 98, as shown by staircase-shaped data line portions D' of data lines D in FIG. 19. At the transition between the main portion of substrate 24 and tail portion 24T of substrate 24, data lines portions D" may extend diagonally.

Figure 20:
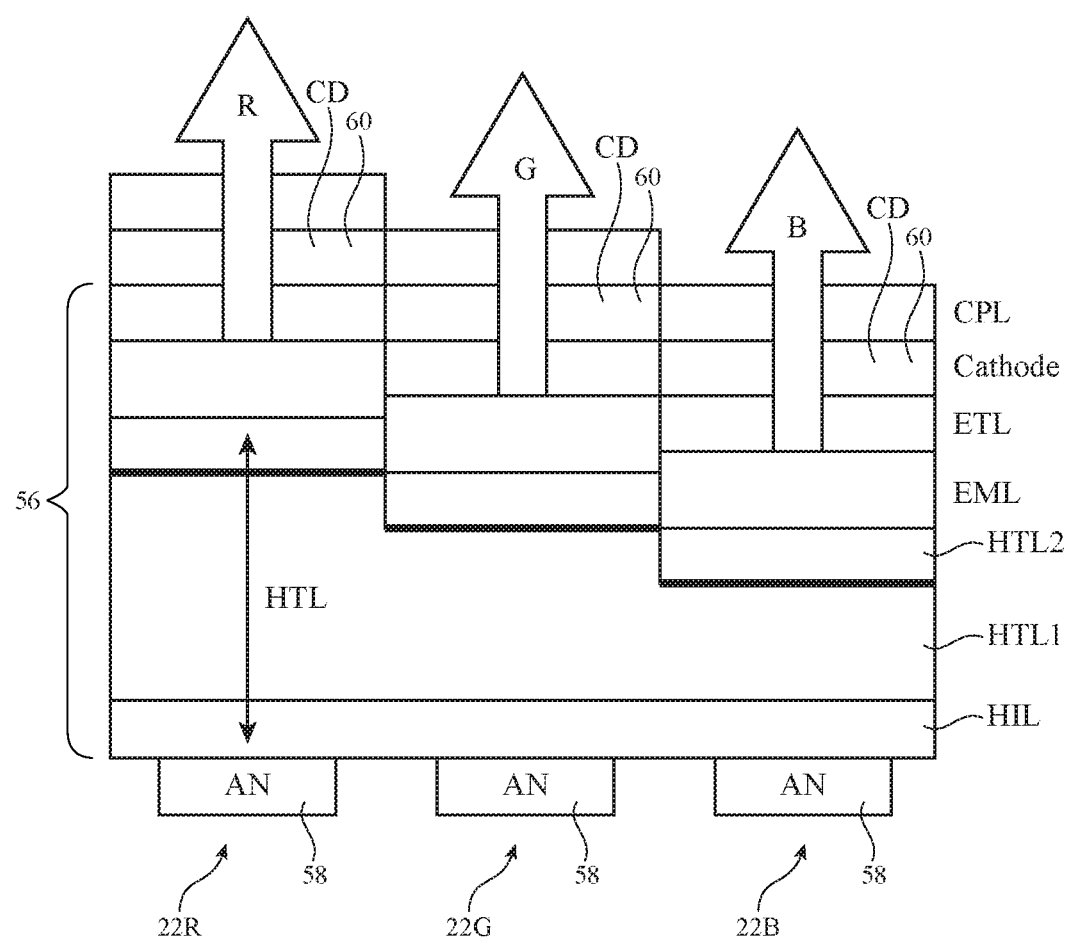
FIG. 20 is a cross-sectional side view of layers in an illustrative organic light-emitting diode display in accordance with an embodiment.

FIG. 20 is a cross-sectional side view of a portion of display 14 with pixels 22 of multiple colors (see, e.g., red pixel 22R, green pixel 22G, and blue pixel 22B). In this illustrative configuration of display 14, each pixel has an anode AN formed from layer 58, a hole injection layer (HIL) that is formed from a blanket film, first hole transport layer HTL1 (a partially common layer), second hole transport layer HTL2 (a blanket film common to all pixels), emissive material EML, a common electron transport layer (ETL), a cathode CD including blanket cathode layer 60, and a capping layer CPL (e.g., a tuning layer of about 70 nm in thickness or other suitable thickness).

Figure 21:
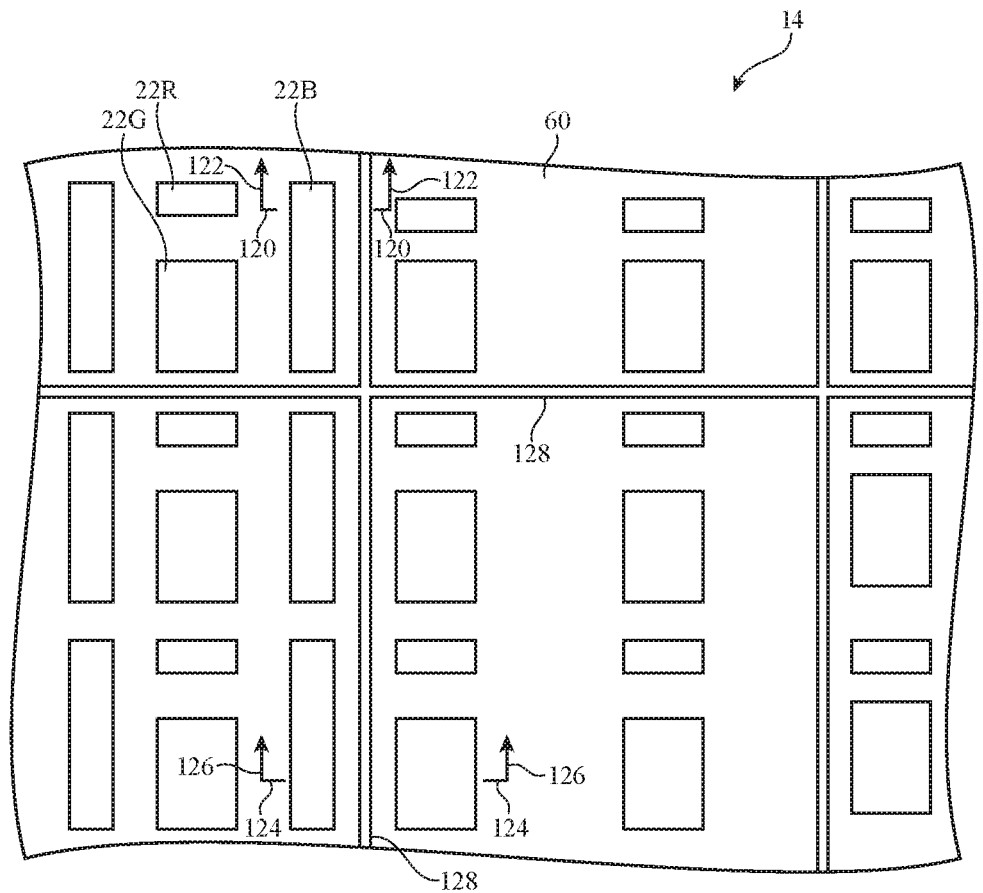
FIG. 21 is a top view of an illustrative display with a mesh of laser-deposited signal lines to reduce power supply voltage drops in accordance with an embodiment.

FIG. 21 is a top view of an active area of display 14 in an illustrative configuration in which display 14 has pixels such as pixels 22R, 22G, and 22B of FIG. 20. As shown in FIG. 21, blanket cathode metal layer 60 may overlap all of the pixels in the active area of display 14. Layer 60 may be formed from a metal such as magnesium silver or other suitable metal and may be sufficiently thin (e.g., 10-18 nm, more than 8 nm, less than 25 nm, etc.) to be transparent to light 40 emitted by diodes 38 in the pixels. Layer 60 may be used to distribute ground power supply voltage ELVSS to cathodes CD of diodes 38. Due to the relatively small thickness of layer 60, layer 60 may have a relatively high sheet resistance (e.g., about 10 ohm/square). To reduce the sheet resistance of the cathode layer in the arrangement of FIG. 21, supplemental cathode paths such as metal lines 128 (e.g., vertical and/or horizontal lines) may be incorporated into the cathode. Lines 128 may be deposited using any suitable metal deposition technique. For example, lines 128 may be deposited using a laser deposition system in which metal for lines 128 is ablated from a target and redeposited onto the exposed surface of cathode layer 60 in a vacuum chamber.

Figure 22:
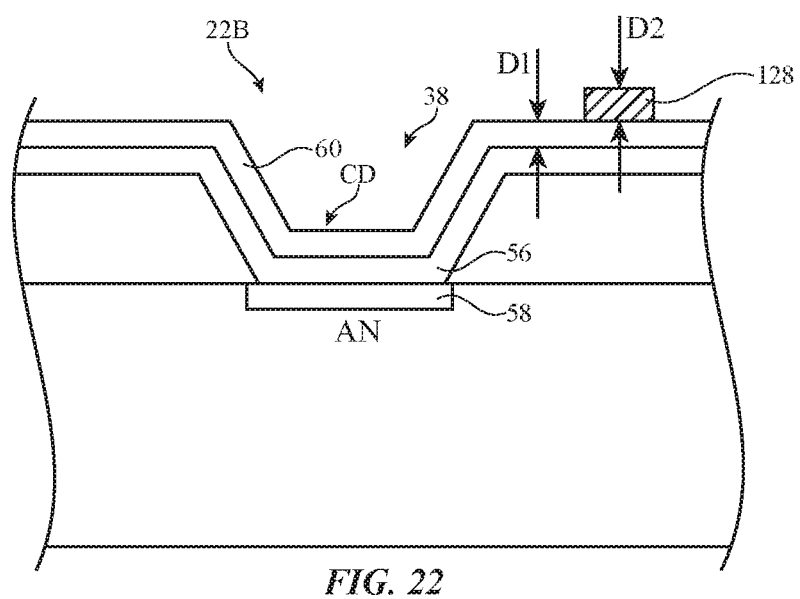
FIG. 22 is a cross-sectional side view of a portion of the display of FIG. 21 in accordance with an embodiment.

FIG. 22 is a cross-sectional side view of display 14 taken along line 120 and viewed in direction 122. As shown in FIG. 22, light-emitting diode 38 may have an anode AN and cathode CD. Cathode CD may be formed from a portion of blanket cathode metal layer 60. Supplemental lines 128 (e.g., horizontal and/or vertical supplemental lines that form a mesh pattern or other suitable pattern) may be formed on layer 60 and shorted to layer 60 and may therefore reduce the sheet resistance of the cathode path being used to distribute ground power supply voltage ELVSS to light-emitting diodes 28. With one illustrative arrangement, the thickness D1 of layer 60 is about 10-18 nm (e.g., more than 8 nm, less than 25 nm, etc.) and the thickness D2 of line 128 is 10 times greater than D1 (e.g., D2 may be 5 times D1 or more, may be 20 times D1 or less, etc.).

Figure 23:
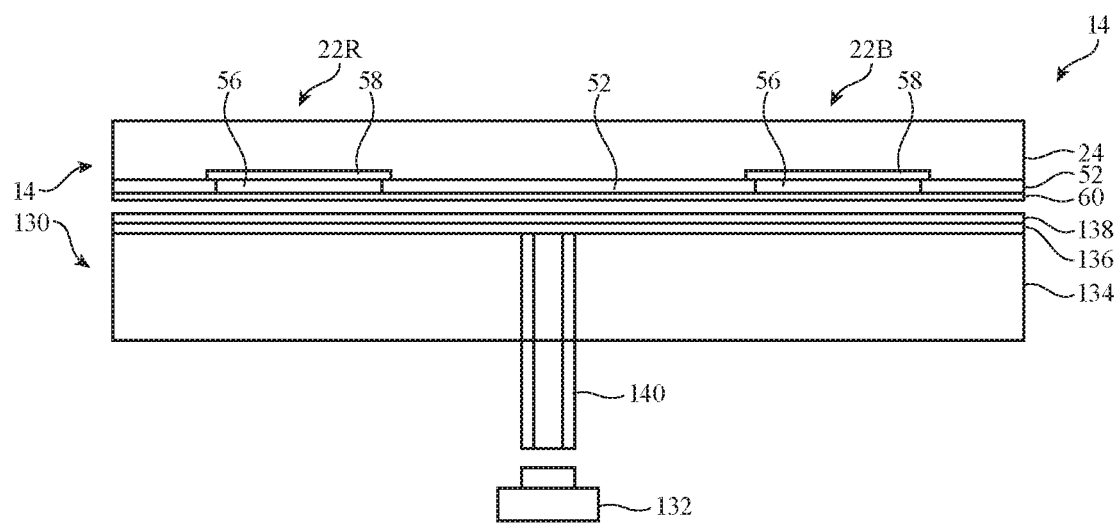
FIGS. 23 and 24 are cross-sectional side views of a portion of the display of FIG. 21 during fabrication in accordance with an embodiment.
Figure 24:
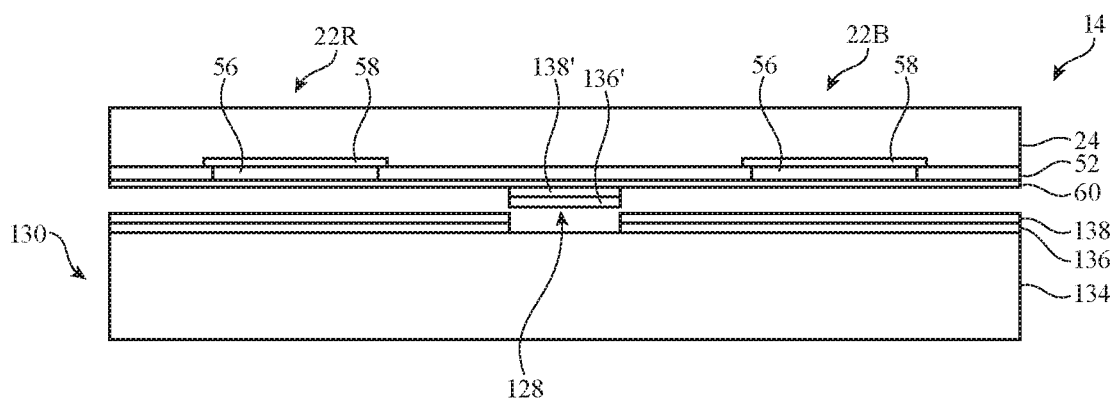
Figure 25:
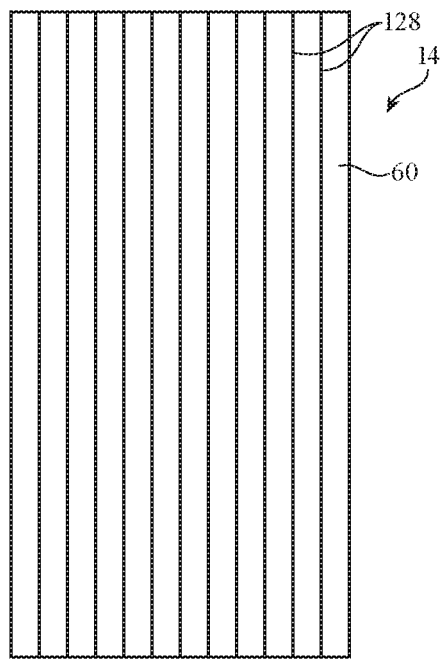
FIGS. 25, 26, 27, and 28 are top views of illustrative patterns that may be used for paths such as laser-deposited signal lines in a display such as the display of FIG. 21 in accordance with an embodiment.
Figure 26:
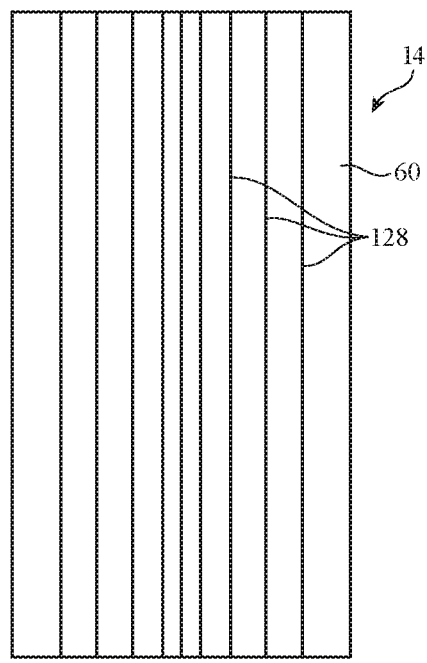
Figure 27:
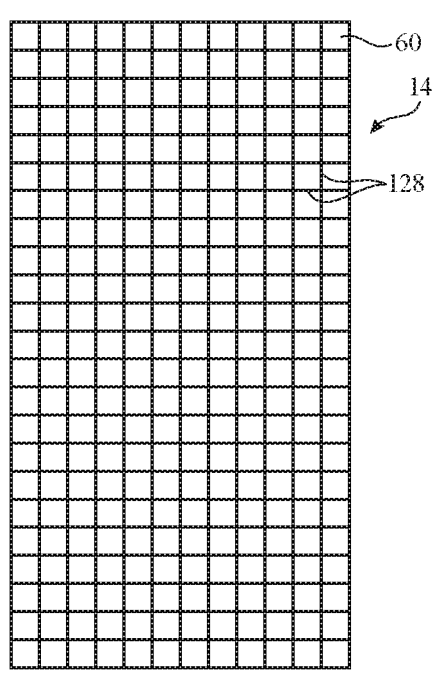
Figure 28:
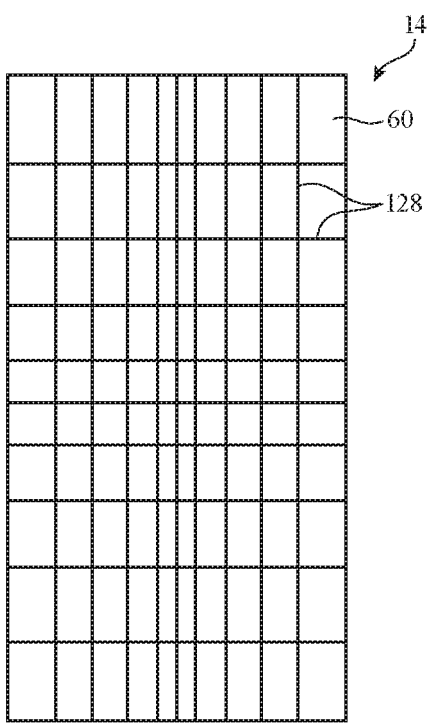

FIGS. 23 and 24 show how a laser deposition system may be used to deposit metal lines 128 onto metal layer 60. As shown in FIG. 23, a target such as target 130 may be placed adjacent to the surface of display 14 after cathode metal layer 60 has been deposited over the surface of display 14. Target 130 may include a transparent substrate (e.g., glass) such as transparent substrate 134, a layer of heat absorbing material such as layer 136, and a layer of high conductivity material such as layer 138. Heat absorbing layer 136 may be formed from low-reflectivity metals (e.g., molybdenum, tungsten, etc.) or other suitable materials that absorb laser beam 140 when laser beam 140 is emitted by laser 132. Laser beam 140 may include ultraviolet light, visible light, and/or infrared light and may be have a diameter of 1-1.2 microns, more than 1 micron, less than 5 microns, or other suitable size. Beam 140 may be a pulsed laser beam (e.g., a beam having a pulse width of 1 fs to 100 ps or more than 100 ps) to facilitate heating of the illuminated portion of heat absorbing layer 136. Layer 138 may be formed from a highly conductive metal such aluminum, zinc, magnesium, silver, etc. Configurations in which more than two layers of metal or only a single layer of metal are formed on substrate 134 may also be used.

As shown in FIG. 24, when laser 132 applies laser light 140 to target 130, portions 138' and 136' of layers 138 and 136 are heated and portions 138' and 136' are ablated or otherwise removed from target 130 and redeposited on adjacent portions of layer 60 in display 14. The deposited metal of portions 138' and 136' forms conductive line 128 to help reduce the sheet resistance of the conductive structure (i.e., the cathode layer) that is used in distributing ground voltage ELVSS to diodes 38.

FIGS. 25, 26, 27, and 28 are top views of display 14 showing illustrative patterns that may be used for supplemental cathode lines 128 (e.g., laser-deposited metal lines). Lines 128 may have a uniform vertical or horizontal layout (see, e.g., illustrative vertical lines 128 of FIG. 25), may have a non-uniform vertical or horizontal layout (see, e.g., illustrative vertical lines 128 of FIG. 25), or may have uniform (FIG. 27) or non-uniform (FIG. 28) mesh shapes. Other patterns or combinations of these patterns may be used in forming lines 128 if desired and may be used in combination with cathode structures formed from metal layer 91 (e.g., paths 90 of FIG. 6). The configurations of FIGS. 25, 26, 27, and 28 are merely illustrative.

Figure 29:
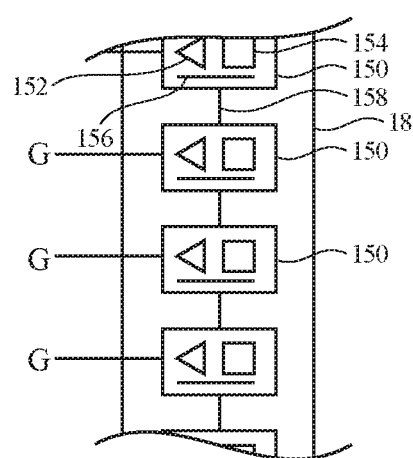
FIG. 29 is a diagram of illustrative gate driver circuitry formed from thin-film transistor circuitry on a display substrate in accordance with an embodiment.

FIG. 29 is a diagram showing how gate driver circuitry 18 may have regions of circuitry for driving horizontal control signals (gate signals) onto horizontal gate lines G of display 14. As shown in FIG. 29, for example, gate driver circuitry 18 may have blocks of gate driver circuitry such as gate driver row blocks 150 that are interconnected using paths 158. Each gate driver row block 150 may include circuitry such as output buffers and other output driver circuitry 152, register circuits 154 (e.g., registers that can be chained together by paths 158 to form a shift register), and paths 156 (e.g., signal lines, power lines, and other interconnects). Each gate driver row block 150 may supply one or more gate signals to one or more respective gate lines in a corresponding row of the pixels of the array of pixels in the active area of display 14.

Figure 30:
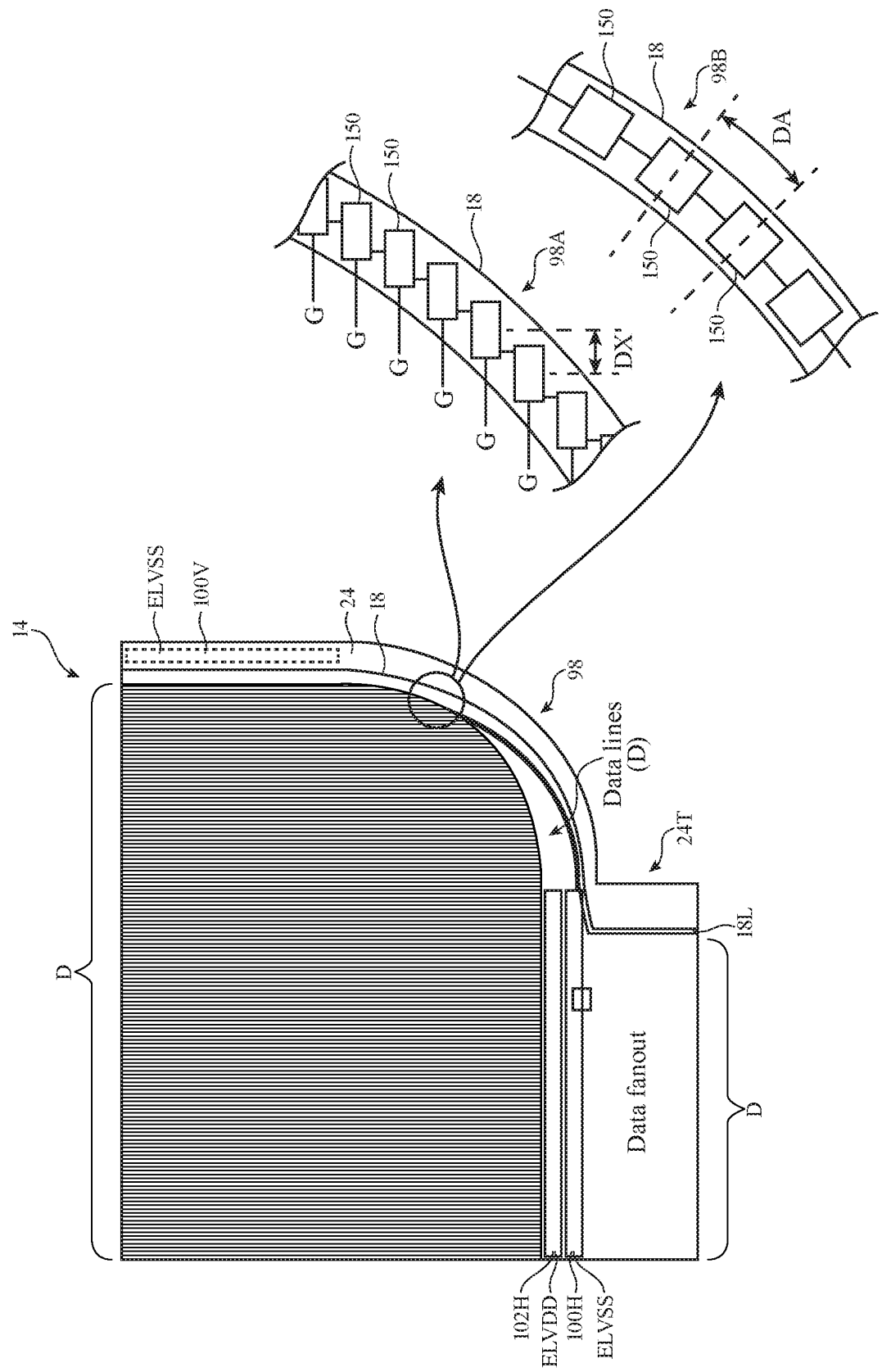
FIG. 30 is a diagram of an illustrative display showing how gate driver row blocks may be laterally offset and rotated to accommodate display substrates with curved edges in accordance with an embodiment.

FIG. 30 shows how gate driver row blocks 150 may be laterally offset (e.g., by providing blocks 150 with varying horizontal offsets DX along a dimension parallel to the horizontal axis along which gate lines G run) and/or may be rotated into different angular orientations (e.g., by rotating blocks 150 so that they have angular orientations with varying angular offsets DA) to accommodate curved edge 98 of display substrate 24. Gate driver circuitry with laterally varying gate driver row block positions and/or angularly varying gate driver row block orientations may include a unique lateral position and/or angular orientation for each block 150 or may use a set of two or more different lateral positions and/or angular orientations to enhance the ability of gate driver circuitry 18 to accommodate curved display substrate edges. Control signals (e.g., clocks signals and other timing signals) may be supplied to gate driver circuitry using gate driver circuitry control lines such as lines 18L that extend along tail portion 24T of substrate 24.

Figure 31:
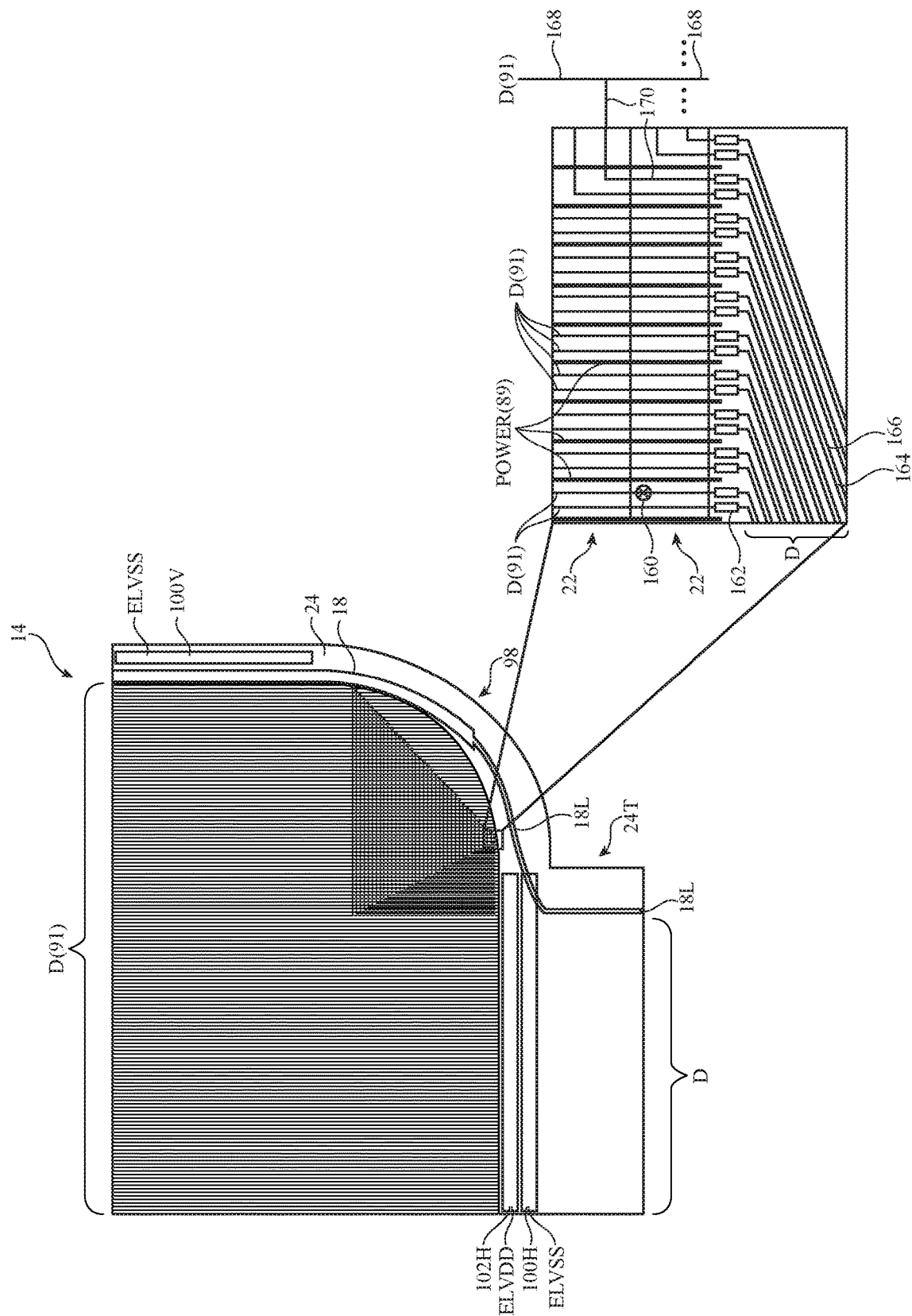
FIG. 31 is a diagram of an illustrative display showing how data line extensions that overlap an active area of a display may be used to route signals from diagonal data line segments to vertical portions of data lines in accordance with an embodiment.

As shown in FIG. 31, data lines D may have L-shaped data line extensions such as extension 170 that help distribute data signals to vertical data lines D that are located at curved corner 98 of display substrate 24 without consuming excessive inactive border area. Extensions 170 may be formed in the active area of display 14. As shown in FIG. 31, for example, data lines D on tail 24L may include diagonal data line segments such as segments 164 and 166. Segments 164 and 166 may be formed from the same layer of metal or may be patterned from two or more different metal layers. As an example, alternate diagonal segments such as segments 164 and 166 may be formed from respective first and second gate metal layers to enhance packing density. Data line portions 164 and 166 may be coupled to vertical data line portions such as lines D that are formed in a metal layer such as second source-drain metal layer 91 using vias 162. Pixels 22 may include vias such as illustrative via 160 to connect data lines formed from metal layer 91 (i.e., D (metal layer 91) of FIG. 31) to internal paths in pixels 22 formed from metal layer 89 (i.e., source and drains for transistors in pixels 22). Power lines formed from metal layer 89 may be interleaved with data lines D (metal layer 91). L-shaped extensions 170 may be formed from metal layer 91 and may overlap the corner of the active area of display 14, so as not to intrude into the inactive area along the edge of the substrate of display 14.

Figure 32:
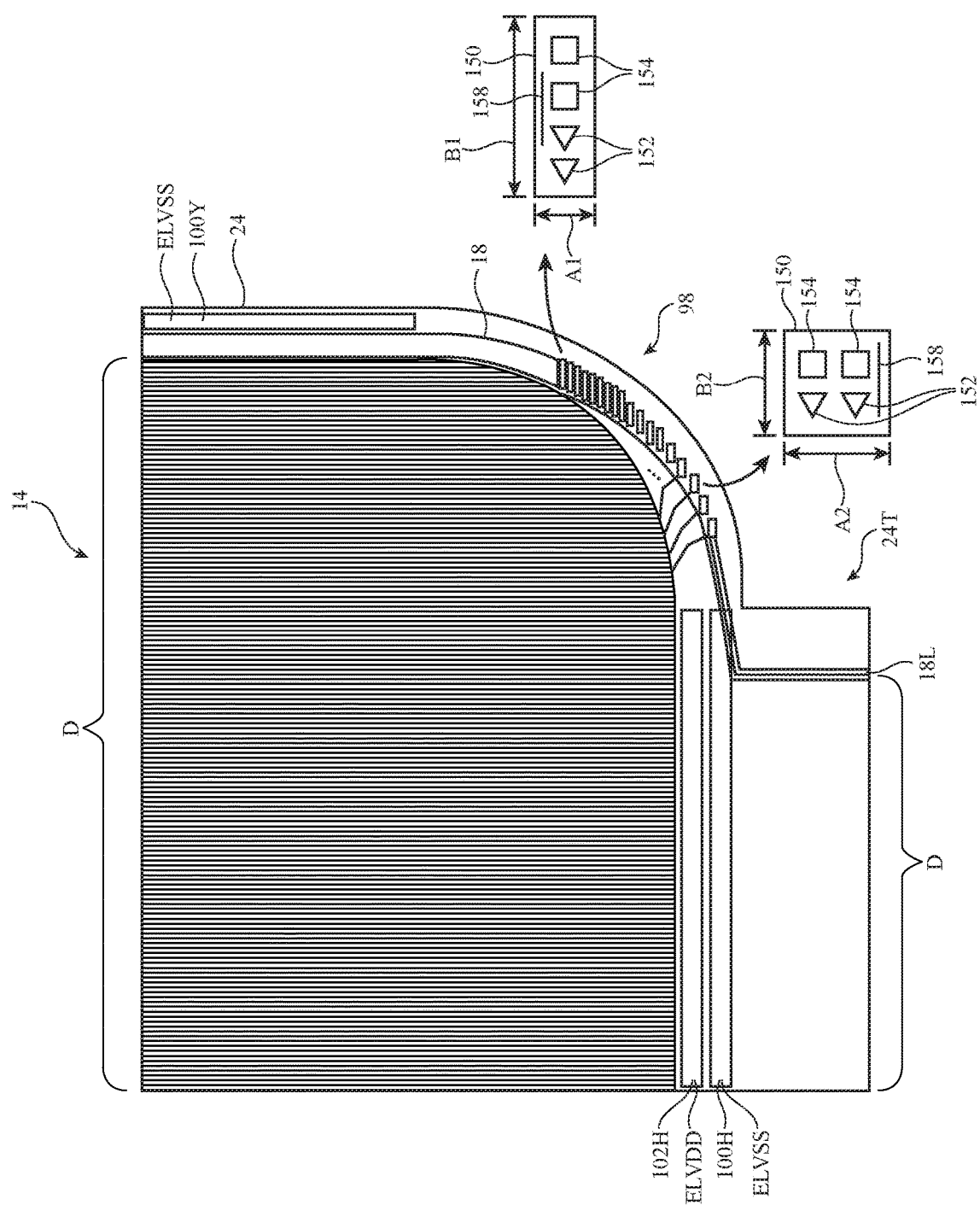
FIG. 32 is a diagram showing how display driver circuitry such as gate driver row blocks may have different shapes in different rows to accommodate curved display substrate edges in accordance with an embodiment.

FIG. 32 is a diagram showing how display driver circuitry such as gate driver row blocks 150 may have different shapes in different rows to accommodate curved display substrate edges such as the curved portion of substrate 24 at corner 98. As shown in FIG. 32, blocks 150 may, for example, be rectangular blocks of assorted shapes with varying aspect ratios (i.e., the vertical dimension divided by the horizontal dimension of each block 150 may potentially differ). As an example, some of blocks 150 may have relatively small aspect ratios (see, e.g., the block having small height A1 and large width B1) whereas other blocks 150 may have relatively large aspect ratios (see, e.g., the block having moderate height A2 and moderate width B2). Circuitry 152, 154, and 158 in blocks 150 can be arranged to accommodate custom footprints (outlines when viewed from above) for each block 150 or for each set of blocks 150. In general, any suitable type of customization of blocks 150 may be implemented around curved display edges such as corner 98 (e.g., shape customization, lateral offset customization, angular orientation customization, size customization, circuit component customization, etc.). Blocks 150 may each be customized or sets of blocks may be customized to accommodate the curved display substrate edge.

Figure 33:
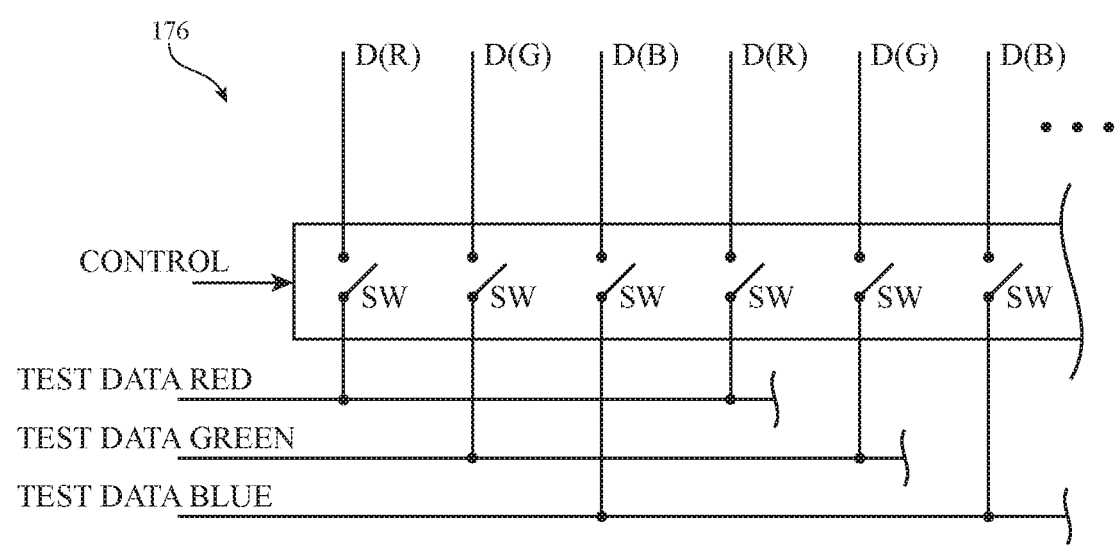
FIG. 33 is a diagram of illustrative display testing multiplexer circuitry of the type that may be formed from a portion of the thin-film transistor circuitry on a display substrate in accordance with an embodiment.

Testing circuitry may be implemented on display 14. For example, testing multiplexer circuitry such as testing multiplexer circuitry 176 of FIG. 33 may be provided along the upper or lower edge of display 14. Circuitry 176 may be used to route a relatively small number of test signals onto a relatively large number of data lines to facilitate pixel testing during manufacturing. During testing, switches SW may be selectively operated to provide test data to data lines D in display 14. For example, switches SW of circuitry 176 may be opened and closed to route test data for red data lines D(R) such as TESTDATARED to red data lines D(R), to route test data for green data lines D(G) such as TESTDATAGREEN to green data lines D(G), and to route test data for blue data lines D(B) such as TESTDATABLUE) to blue data lines D(B). Lines D(R) may be used to route data to red pixels, lines D(G) may be associated with green pixels, and lines D(B) may be coupled to the blue pixels of display 14.

Test data may by supplied to display 14 from tester that is coupled to test pads on substrate 24 and/or from circuitry attached to substrate 24. External tester schemes may be used when it is desired to perform testing before attaching a display driver integrated circuit to substrate 24. Test lines may route signals (e.g., TESTDATARED, TESTDATAGREEN, TESTDATABLUE and three corresponding multiplexer control signals for the red, green, and blue switches in switches SW) between the test pads and testing circuitry such as circuitry 176. Circuitry 176 may be controlled by an external test circuit or other controller so that data lines of different colors can receive test data in desired patterns. This allows pixels 22 of different colors in display 14 to be independently tested. When testing is complete, switches SW can be left permanently opened so that the data lines D in display 14 are not shorted together and can be used normally to route data signals to pixels 22.

Figure 34:
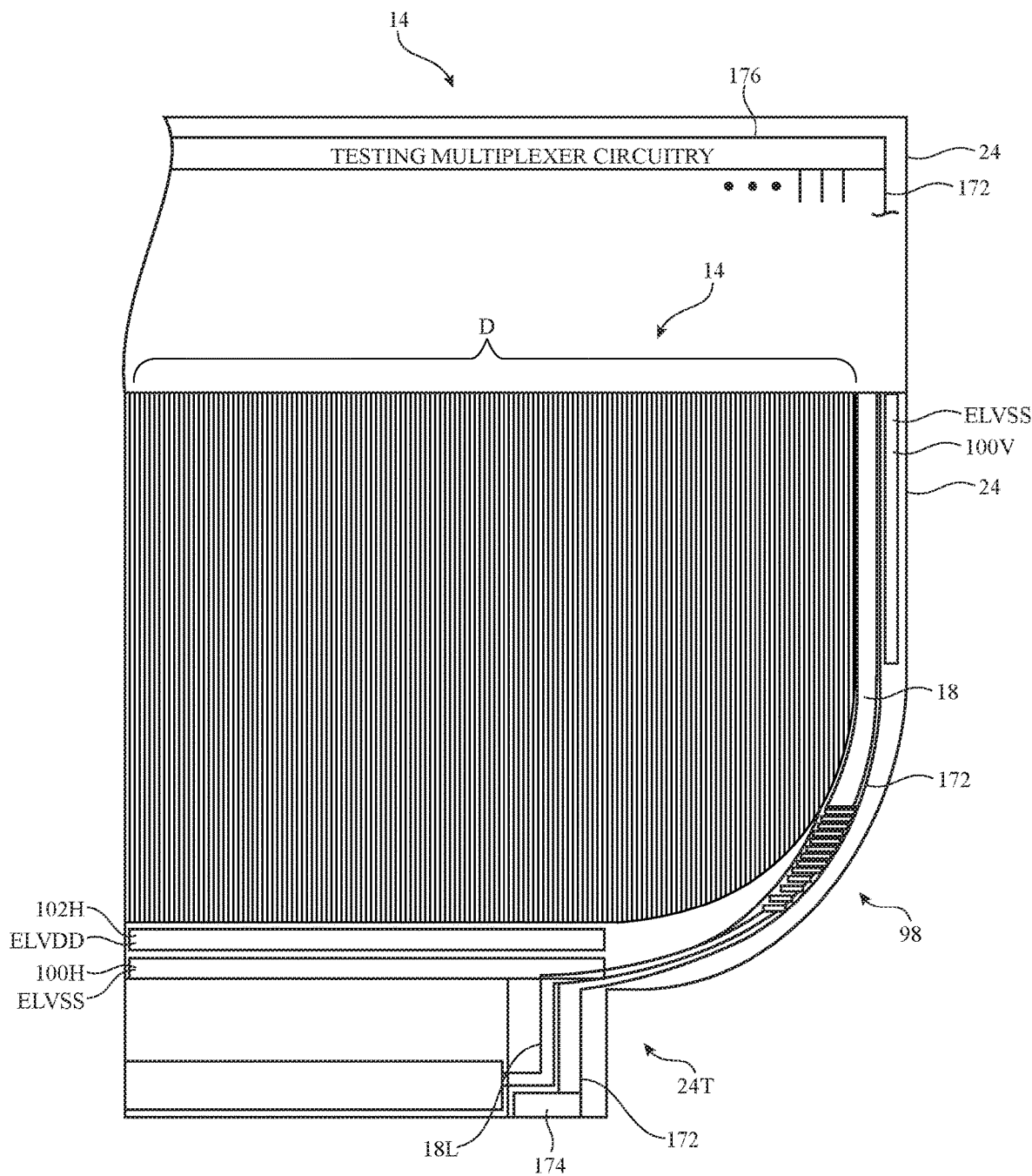
FIG. 34 is a diagram of an illustrative display showing how test signals may be routed between test pads at a lower edge of the display to testing multiplexer circuitry along an upper edge of the display in accordance with an embodiment.

FIG. 34 is a diagram of an illustrative display with testing circuitry. As shown in FIG. 34, testing multiplexer circuitry 176 and test pads 174 may be located on opposing edges of display 14. For example, test pads 174 may be located on tail portion 24L of substrate 24 at the lower edge of display 14 and testing multiplexer circuitry 176 may be located along the upper edge of display 14. Test signal lines 172 may be used to route test signals between test pads 174 on the lower edge of display 14 to testing multiplexer circuitry 176 along the upper edge of display 14.

Figure 35:
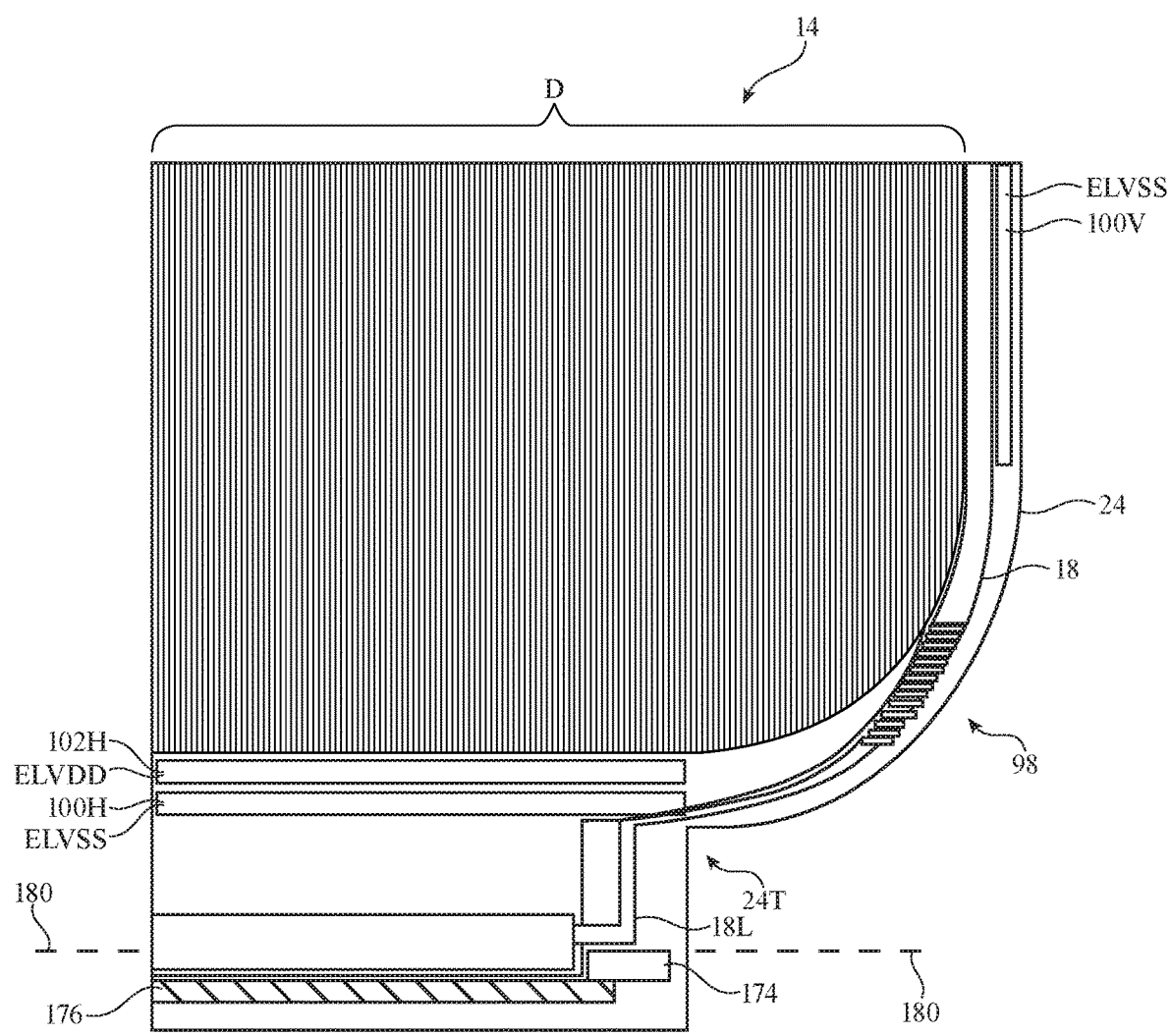
FIG. 35 is a diagram of an illustrative display showing how testing multiplexer circuitry and test pads may be located along a portion of a display substrate tail on a lower edge of the display in accordance with an embodiment.

As shown in the illustrative configuration of FIG. 35, testing multiplexing circuitry 176 may be located along the lower edge of tail portion 24T of substrate 24 adjacent to pads 174. Following testing, testing multiplexing circuitry 176 and pads 174 may be removed from tail 24T (e.g., by cutting off circuitry 176 and pads 174 using a cut formed in tail 24T along cut line 180 of FIG. 35).

Figure 36:
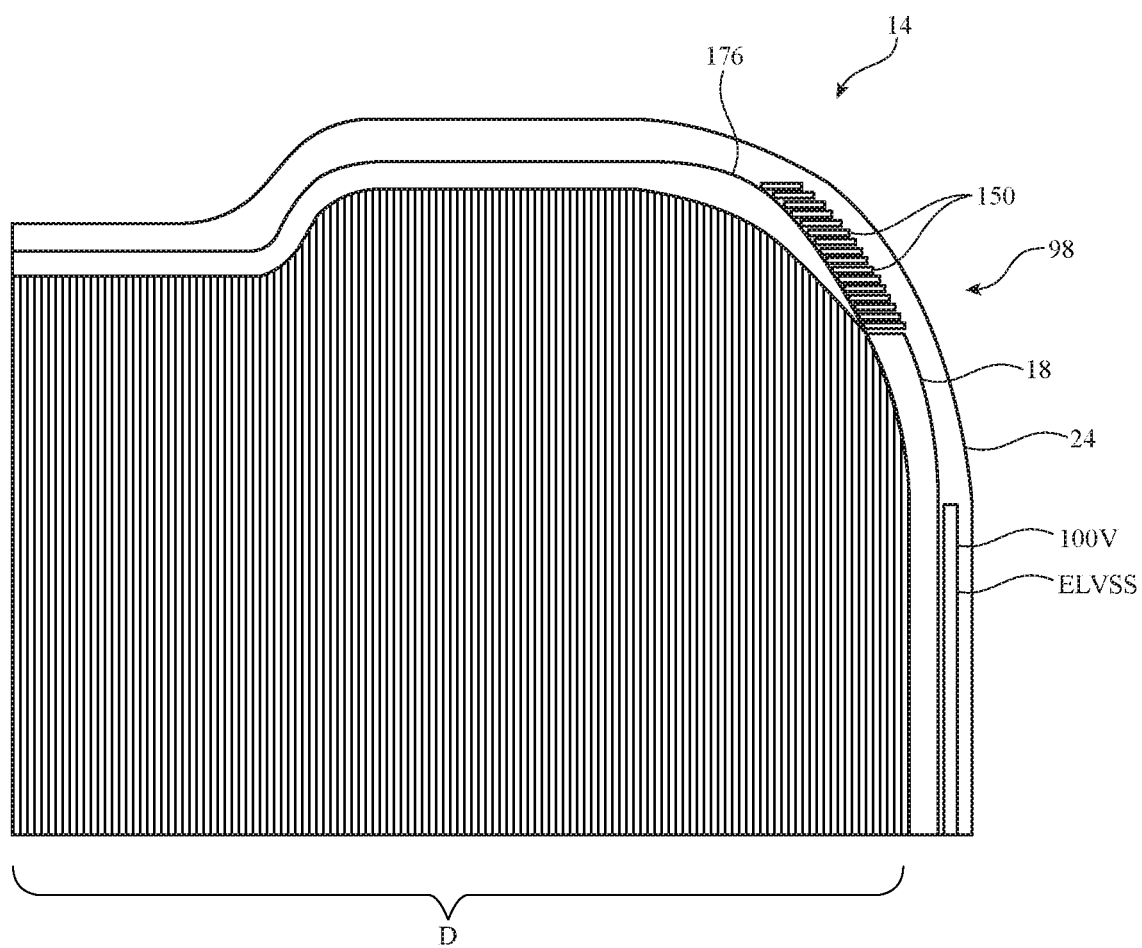
FIGS. 36 and 37 are diagrams of illustrative displays in which testing circuitry is arranged to accommodate a curved display substrate edge in accordance with embodiments.
Figure 37:
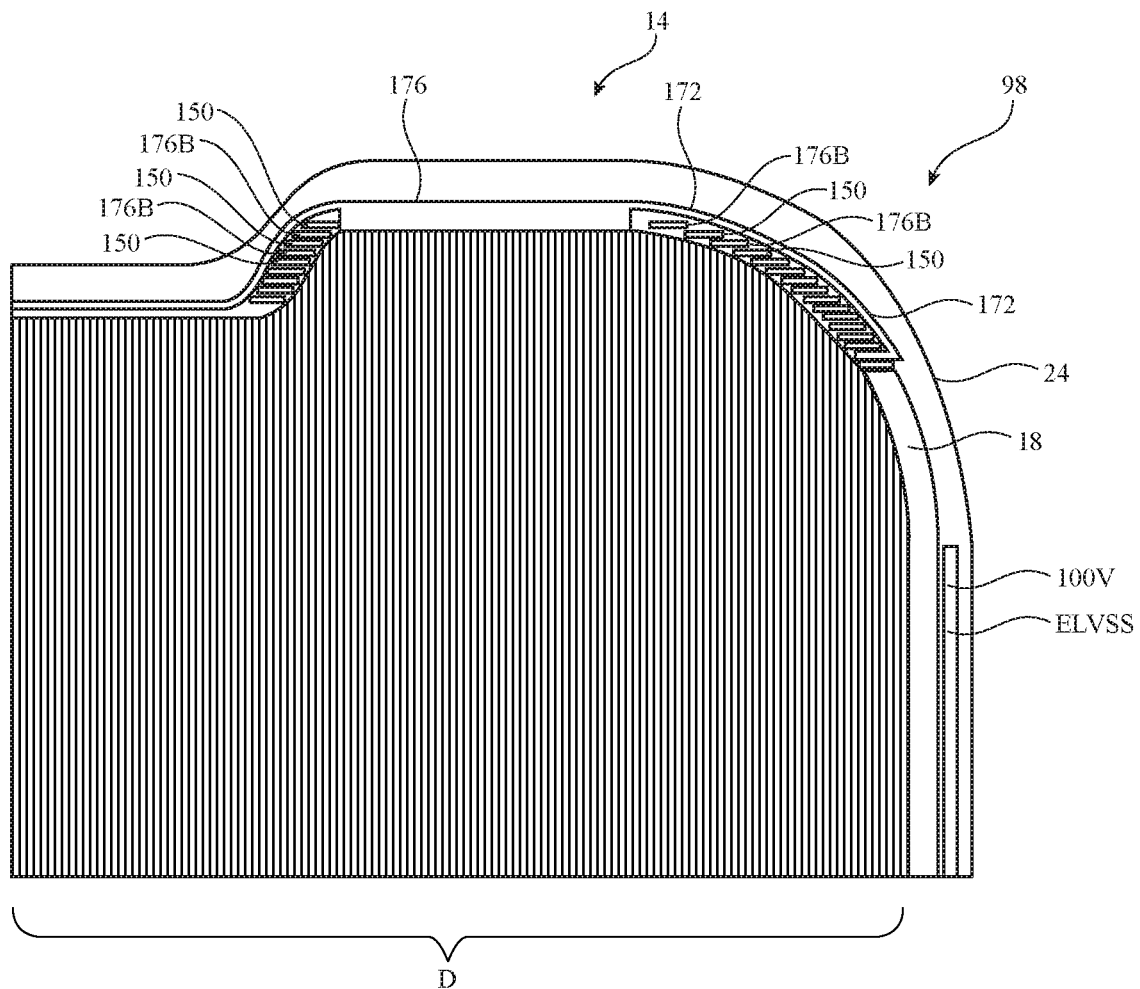

FIGS. 36 and 37 show how multiplexer testing circuitry 176 may be accommodated along a curved portion of display 14. In the illustrative arrangement of FIG. 36, circuitry 176 is formed within a curved and tapered region along the curved edge of the active area of display 14 between blocks 150 of gate driver circuitry 18 and data lines D. FIG. 37 shows an illustrative configuration in which regions of testing multiplexer circuitry 176 such as testing multiplexer circuit blocks 176B are interspersed with regions of gate driver circuitry 18 such as gate driver row blocks 150. By placing blocks 176B between respective pairs of blocks 150, gate driver circuitry 18 and testing multiplexer circuitry 176 may be efficiently packed along the edge of the active area. This helps minimize the width of the inactive area along the edge of substrate 24 in which display driver circuitry 18 and testing multiplexer circuitry 176 are formed. Testing multiplexer circuit blocks 176B may have varying location-dependent shapes (e.g., different sizes, aspect ratios, etc.), angular orientations, and/or lateral positions along a dimension parallel to gate lines G, as described in connection with gate driver circuitry 18 of FIG. 30 to help enhance the layout of the circuitry in the inactive area of display 14. Other arrangements in which regions of texting multiplexer circuitry 176 are located between regions of gate driver circuitry 18 or are otherwise arranged to help accommodate curved display substrate edges may be used, if desired. The configuration of FIG. 37 is illustrative.

In accordance with an embodiment, an organic light-emitting diode display having an active area with an array of pixels is provided that includes a substrate, thin-film transistor circuitry on the substrate that includes dielectric layers, a pixel definition layer on the thin-film transistor circuitry, the pixel definition layer has openings each of which contains an organic emissive layer for an organic light-emitting diode and each of which is associated with a respective one of the pixels, and a cathode layer that covers the array of pixels, and a metal ground power supply path embedded within dielectric layers in the active area, the metal ground power supply path carries a ground power supply voltage to the cathode layer.

In accordance with another embodiment, the metal ground power supply path is formed from a first portion of a metal layer and a second portion of the metal layer forms via structures that contact source-drain terminals of transistors in the thin-film transistor circuitry.

In accordance with another embodiment, the metal ground power supply path or positive power supply path has a mesh shape.

In accordance with another embodiment, the active area has rounded corners and the metal ground power supply path or positive power supply path forms a mesh with rounded corners.

In accordance with another embodiment, the metal ground power supply path or positive power supply path includes L-shaped portions.

In accordance with another embodiment, the organic light-emitting diode display includes first and second patterned metal layers embedded in the dielectric layers, the metal ground power supply path includes metal segments formed from the second patterned metal layer and the first patterned metal layer includes strips of metal that carry the ground power supply voltage.

In accordance with another embodiment, the display has edges and the strips of metal run along at least some of the edges.

In accordance with another embodiment, the first patterned metal layer includes a positive power supply strip of metal that runs parallel to one of the strips of metal that carry the ground power supply voltage.

In accordance with another embodiment, the metal segments include L-shaped portions and at least some of the L-shaped portions cross over the positive power supply strip of metal.

In accordance with another embodiment, the organic light-emitting diode display includes positive power supply distribution paths that extend to the pixels across the active area from the positive power supply strip of metal.

In accordance with another embodiment, the active area has rounded corners and the L-shaped portions are located at the rounded corners.

In accordance with another embodiment, source-drain terminals for transistors in the thin-film transistor circuitry are formed from a first metal layer embedded in the dielectric layers and the metal ground power supply path is formed from a second metal layer embedded in the dielectric layers.

In accordance with another embodiment, anodes for the organic light-emitting diodes are formed from a third metal layer that is embedded in the dielectric layers and that is interposed between the second metal layer and the cathode layer.

In accordance with another embodiment, a portion of the third metal layer shorts the metal ground power supply path formed from the second metal layer to the cathode layer.

In accordance with another embodiment, the metal ground power supply path includes laser-deposited metal lines.

In accordance with another embodiment, the organic light-emitting diode layer includes data lines that supply data to the pixels, the data lines include staircase-shaped portions.

In accordance with an embodiment, an organic light-emitting diode display having an array of pixels is provided that includes a substrate, a layer of thin-film transistor circuitry on the substrate, a pixel definition layer on the layer of thin-film transistor circuitry, the pixel definition layer has openings each of which contains an organic emissive layer for an organic light-emitting diode and each of which is associated with a respective one of the pixels, a cathode layer that covers the array of pixels and that distributes a ground power supply voltage to the organic light-emitting diode in each of the openings, and a patterned metal mesh that is shorted to the cathode layer and that helps distribute the ground power supply voltage.

In accordance with another embodiment, the patterned metal mesh includes laser-deposited metal lines on the cathode layer.

In accordance with another embodiment, the cathode layer is formed from a first layer of metal, the patterned metal mesh is formed from a second layer of metal, and anodes for the organic light-emitting diodes are formed from a third layer of metal that is interposed between the first and second layers of metal.

In accordance with another embodiment, the organic light-emitting diode display includes laser-deposited metal lines on the cathode layer.

In accordance with another embodiment, the substrate has rounded corners.

In accordance with another embodiment, the organic light-emitting diode display includes data lines that distribute data signals to the pixels, the data lines include portions with staircase shapes.

In accordance with an embodiment, an organic light-emitting diode display having an array of pixels is provided that includes a substrate, a layer of thin-film transistor circuitry having dielectric layers on the substrate, a pixel definition layer on the layer of thin-film transistor circuitry, the pixel definition layer has openings each of which contains an organic emissive layer for an organic light-emitting diode and each of which is associated with a respective one of the pixels, and a cathode layer that covers the array of pixels, the cathode layer receives a ground power supply voltage and distributes the ground power supply voltage to the organic emissive layers in the openings, a first metal layer embedded in the dielectric layers that forms source-drain terminals for thin-film transistors in the layer of thin-film transistor circuitry, a second metal layer embedded in the dielectric layers that is patterned to carry the ground power supply voltage to the cathode layer, and a third metal layer that has a first portion that is patterned to form anodes for the organic light-emitting diodes and a second portion that shorts the second metal layer to the cathode layer.

In accordance with another embodiment, the substrate has curved edges.

In accordance with another embodiment, the organic light-emitting diode display includes data lines that convey data to the array of pixels, gate lines that extend perpendicular to the data lines, and gate driver circuitry formed from the thin-film transistor circuitry, the gate driver circuitry has gate driver row blocks that are each coupled to at least a respective one of the gate lines.

In accordance with another embodiment, the gate driver row blocks include gate driver row blocks of different aspect ratios.

In accordance with another embodiment, the organic light-emitting diode display includes testing multiplexer circuitry including blocks of testing multiplexer circuitry between respective pairs of the gate driver row blocks.

In accordance with an embodiment, an organic light-emitting diode display is provided that includes thin-film transistor circuitry, a substrate having an active area with an array of pixels formed from a portion of the thin-film transistor circuitry and having an inactive area that is free of pixels and that runs along an edge of the active area adjacent to an edge of the substrate, data lines that supply data to the array of pixels, gate lines that run perpendicular to the data lines and that supply control signals to the array of pixels, and gate driver circuitry in the inactive area this is formed from a portion of the thin-film transistor circuitry, the gate driver circuitry runs along a curved portion of the edge of the substrate.

In accordance with another embodiment, the gate driver circuitry has a plurality of gate driver row blocks each of which is coupled to at least one of the gate lines in a respective row of pixels in the array of pixels.

In accordance with another embodiment, the gate driver row blocks include first and second gate driver row blocks with different shapes in respective first and second rows of the pixels.

In accordance with another embodiment, the gate driver row blocks include first and second gate driver row blocks with different angular orientations in respective first and second rows of the pixels.

In accordance with another embodiment, the gate driver row blocks include gate driver row blocks in different rows of the pixels that are offset by different amounts along a dimension running parallel to the gate lines so that the gate driver row blocks accommodate the curved portion of the edge of the substrate.

In accordance with another embodiment, the organic light-emitting diode display includes testing multiplexer circuitry that is coupled to the data lines.

In accordance with another embodiment, the testing multiplexer circuitry runs along at least part of the curved portion of the edge of the substrate.

In accordance with another embodiment, the testing multiplexer circuitry includes regions of testing circuitry between the gate driver row blocks.

In accordance with another embodiment, the data lines include L-shaped data line portions.

In accordance with another embodiment, the data lines have data line portions extending perpendicular to the gate lines and some of the data lines each have a diagonal portion and an L-shaped extension coupling the diagonal portion to a respective one of the data line portions extending perpendicular to the gate lines.

In accordance with an embodiment, an organic light-emitting diode display is provided that includes thin-film transistor circuitry, a substrate having an active area with an array of pixels formed from a portion of the thin-film transistor circuitry and having an inactive area that is free of pixels and that runs along an edge of the active area adjacent to an edge of the substrate, gate driver circuitry formed from a portion of the thin-film transistor circuitry in the inactive area, gate lines that supply control signals to the array of pixels from the gate driver circuitry, and data lines that supply data to the array of pixels, the data lines have data line portions extending perpendicular to the gate lines and some of the data lines each have a diagonal portion and an L-shaped extension coupling the diagonal portion to a respective one of the data line portions extending perpendicular to the gate lines.

In accordance with another embodiment, the edge of the substrate has a curved portion, the organic light-emitting diode display includes power supply lines having L-shaped segments that overlap the active area.

In accordance with another embodiment, the gate driver circuitry includes a plurality of gate driver row blocks each of which supplies at least one of the control signals to a respective one of the gate lines, the gate driver row blocks include gate driver row blocks with different shapes along the curved portion.

In accordance with another embodiment, the gate driver circuitry includes a plurality of gate driver row blocks each of which supplies at least one of the control signals to a respective one of the gate lines, the gate driver row blocks include gate driver row blocks with different angular orientations along the curved portion.

The foregoing is merely illustrative and various modifications can be made to the described embodiments. The foregoing embodiments may be implemented individually or in any combination.

What is claimed is:

1. An organic light-emitting diode display, comprising:
   thin-film transistor circuitry;
   a substrate having an active area with an array of pixels formed from a portion of the thin-film transistor circuitry and having an inactive area that runs along an edge of the active area adjacent to an edge of the substrate, wherein the substrate has an upper edge, a lower edge, and a side edge that extends between the upper edge and the lower edge;
   data lines that supply data to the array of pixels;
   gate lines that run perpendicular to the data lines and that supply control signals to the array of pixels;
   a first metal strip extending along the lower edge;
   a second metal strip extending along the side edge of the substrate, wherein the data lines short the first metal strip to the second metal strip; and
   gate driver circuitry in the inactive area that is formed from a portion of the thin-film transistor circuitry, wherein the gate driver circuitry runs along a curved portion of the edge of the substrate, wherein the gate driver circuitry has a plurality of gate driver row blocks each of which is coupled to at least one of the gate lines in a respective row of pixels in the array of pixels, wherein the gate driver row blocks include first and second gate driver row blocks in respective first and second rows of the pixels, wherein the first gate driver row block is rotated to have a first angular orientation with respect to the edge of the substrate, and wherein the second gate driver row block is rotated to have a second angular orientation with respect to the edge of the substrate that is different from the first angular orientation.

2. The organic light-emitting diode display defined in claim 1 wherein the gate driver row blocks include first and second gate driver row blocks with different shapes in respective first and second rows of the pixels.

3. The organic light-emitting diode display defined in claim 1 wherein some of the gate driver row blocks in different rows of the pixels are offset by different amounts along a dimension running parallel to the gate lines so that the gate driver row blocks accommodate the curved portion of the edge of the substrate.

4. The organic light-emitting diode display defined in claim 1 further comprising testing multiplexer circuitry that is coupled to the data lines.

5. The organic light-emitting diode display defined in claim 4 wherein the testing multiplexer circuitry runs along at least part of the curved portion of the edge of the substrate.

6. The organic light-emitting diode display defined in claim 4 wherein the testing multiplexer circuitry comprises regions of testing circuitry between the gate driver row blocks.

7. The organic light-emitting diode display defined in claim 1 wherein the data lines comprise L-shaped data line portions.

8. The organic light-emitting diode display defined in claim 1 wherein the data lines have data line portions extending perpendicular to the gate lines and wherein some of the data lines each have a diagonal portion and an L-shaped extension coupling the diagonal portion to a respective one of the data line portions extending perpendicular to the gate lines.

9. An organic light-emitting diode display having edges, comprising:
  thin-film transistor circuitry;
  a substrate having an active area with an array of pixels formed from a portion of the thin-film transistor circuitry and having an inactive area that is free of pixels and that runs along an edge of the active area adjacent to an edge of the substrate, wherein the edge of the substrate has a curved portion;
  gate driver circuitry formed from a portion of the thin-film transistor circuitry in the inactive area;
  gate lines that supply control signals to the array of pixels from the gate driver circuitry;
  data lines that supply data to the array of pixels, wherein the data lines have data line portions extending perpendicular to the gate lines and wherein some of the data lines each have a diagonal portion and an L-shaped extension; and
  power lines interleaved with the data lines, wherein at least one of the L-shaped extensions overlaps at least one of the power lines.

10. The organic light-emitting diode display defined in claim 9 wherein the data lines have staircase-shaped data line portions that correspond with the curved portion of the edge of the substrate.

11. The organic light-emitting diode display defined in claim 9 wherein the L-shaped extension couples the diagonal portion to a respective one of the data line portions extending perpendicular to the gate lines and wherein the L-shaped extension overlaps at least some of the gate lines.

12. The organic light-emitting diode display defined in claim 9 wherein the gate driver circuitry comprises gate driver row blocks that include first and second gate driver row blocks with different shapes in respective first and second rows of the pixels.

13. The organic light-emitting diode display defined in claim 9 wherein the gate driver circuitry comprises gate driver row blocks in different rows of the pixels that are offset by different amounts along a dimension running parallel to the gate lines so that the gate driver row blocks accommodate the curved portion of the edge of the substrate.

* * * * *